United States Patent
Jain et al.

(10) Patent No.: US 9,847,408 B1
(45) Date of Patent: Dec. 19, 2017

(54) FABRICATION OF INTEGRATED CIRCUIT STRUCTURES FOR BIPOLOR TRANSISTORS

(71) Applicant: GLOBALFOUNDRIES INC., Grand Cayman (KY)

(72) Inventors: Vibhor Jain, Essex Junction, VT (US); Qizhi Liu, Lexington, MA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/187,860

(22) Filed: Jun. 21, 2016

(51) Int. Cl.
*H01L 21/331* (2006.01)
*H01L 21/8228* (2006.01)
*H01L 27/082* (2006.01)
*H01L 29/66* (2006.01)
*H01L 29/737* (2006.01)
*H01L 29/161* (2006.01)
*H01L 29/165* (2006.01)
*H01L 29/04* (2006.01)
*H01L 21/8222* (2006.01)
*H03F 3/213* (2006.01)
*H01L 21/8226* (2006.01)

(52) U.S. Cl.
CPC ...... *H01L 29/7378* (2013.01); *H01L 21/8222* (2013.01); *H01L 21/8226* (2013.01); *H01L 21/82285* (2013.01); *H01L 27/0823* (2013.01); *H01L 27/0826* (2013.01); *H01L 29/04* (2013.01); *H01L 29/161* (2013.01); *H01L 29/165* (2013.01); *H01L 29/66242* (2013.01); *H03F 3/213* (2013.01); *H03F 2200/294* (2013.01)

(58) Field of Classification Search
CPC ............ H01L 27/0826; H01L 27/0823; H01L 29/66242; H01L 29/7378; H01L 21/8249; H01L 21/8222–21/82285
See application file for complete search history.

(56) References Cited

U.S. PATENT DOCUMENTS

| | | | |
|---|---|---|---|
| 5,930,635 A * | 7/1999 | Bashir | H01L 21/8228 257/E21.611 |
| 6,472,288 B2 | 10/2002 | Freeman et al. | |
| 6,933,202 B1 * | 8/2005 | Hurwitz | H01L 21/8228 257/588 |
| 7,217,628 B2 | 5/2007 | Sheridan et al. | |

(Continued)

*Primary Examiner* — Marvin Payen
*Assistant Examiner* — Jeremy Joy
(74) *Attorney, Agent, or Firm* — Yuanmin Cai; Hoffman Warnick LLC

(57) ABSTRACT

Methods of according to the present disclosure can include: providing a substrate including: a first semiconductor region, a second semiconductor region, and a trench isolation (TI) laterally between the first and second semiconductor regions; forming a seed layer on the TI and the second semiconductor region of the substrate, leaving the first semiconductor region of the substrate exposed; forming an epitaxial layer on the substrate and the seed layer, wherein the epitaxial layer includes: a first semiconductor base material positioned above the first semiconductor region of the substrate, and an extrinsic base region positioned above the seed layer; forming an opening within the extrinsic base material and the seed layer to expose an upper surface of the second semiconductor region; and forming a second semiconductor base material in the opening.

11 Claims, 24 Drawing Sheets

(56) References Cited

U.S. PATENT DOCUMENTS

| | | | | |
|---|---|---|---|---|
| 7,855,404 B2* | 12/2010 | Heinenman | ........ | H01L 21/82285 257/19 |
| 8,035,167 B2 | 10/2011 | Knoll et al. | | |
| 8,298,901 B1* | 10/2012 | Foote | ................ | H01L 29/66242 257/E21.371 |
| 8,450,179 B2* | 5/2013 | El-Kareh | ............ | H01L 21/8222 257/E21.371 |
| 8,603,885 B2* | 12/2013 | Malladi | ................ | H01L 29/0821 257/E21.381 |
| 9,590,082 B1* | 3/2017 | Jain | ..................... | H01L 29/7371 |
| 2002/0070410 A1* | 6/2002 | Freeman | ............ | H01L 21/8222 257/370 |
| 2004/0065942 A1* | 4/2004 | Trogolo | ............ | H01L 21/82285 257/565 |
| 2004/0248352 A1* | 12/2004 | Gray | ................ | H01L 21/82285 438/199 |
| 2005/0014341 A1* | 1/2005 | El-Kareh | .......... | H01L 29/66242 438/322 |
| 2005/0029624 A1* | 2/2005 | Bottner | ............ | H01L 21/82285 257/552 |
| 2005/0035412 A1* | 2/2005 | Norstrom | ............ | H01L 21/8249 257/370 |
| 2007/0134854 A1* | 6/2007 | Zhang | ............... | H01L 21/82285 438/142 |
| 2009/0085066 A1* | 4/2009 | Preisler | ............... | H01L 27/0825 257/197 |
| 2010/0019326 A1* | 1/2010 | Knoll | ............... | H01L 21/82285 257/370 |
| 2012/0001192 A1* | 1/2012 | Fox | ..................... | H01L 29/0804 257/75 |
| 2015/0372181 A1* | 12/2015 | Kobayashi | .......... | H01L 31/1105 257/187 |

* cited by examiner

FABRICATION OF INTEGRATED CIRCUIT STRUCTURES FOR BIPOLAR TRANSISTORS

BACKGROUND

Embodiments of the disclosure relate generally to the fabrication of integrated circuit (IC) structures for bipolar transistors. More specifically, embodiments of the present disclosure provide processes of forming base materials for bipolar transistors (also known as a bipolar junction transistors, "BJTs," or heterojunction bipolar transistors, "HBTs") with different physical and electrical characteristics on a single substrate.

In integrated circuit (IC) structures, a transistor is a critical component for implementing proposed circuitry designs. In analog circuitry, numerous functions can be implemented with bipolar transistors. For example, the ability to control the flow of electric current between terminals of the transistor can allow the transistor to act as a switch, and therefore act as a building block for logic functions. Bipolar junction transistors are found in a wide variety of devices, e.g., radiofrequency transceivers for wireless networking and cellular applications, multi-gigabit analog-to-digital converters, optical networks, automotive radar, and high-speed circuits. Generally, a bipolar transistor includes three electrical terminals: a collector, a base, and an emitter. The base of the transistor can be subdivided into an intrinsic base positioned directly between the collector and emitter, and an extrinsic base which connects to the base terminal where other circuit elements can connect to the base. The flow of electricity between the collector and emitter terminals of a bipolar transistor can be controlled by adjusting the electric current at the base terminal or by changing the voltage difference between the base and emitter terminals.

Bipolar transistors are a building block of many amplifier circuits, which can be designed to perform various electrical functions, e.g., modifying a current or voltage between two terminals. The processes used to form bipolar transistors can define various attributes of the transistors formed, e.g., base-emitter capacitance, base resistance, current gain across terminals, etc. In some cases, a fabricator may wish to form multiple bipolar transistors with different electrical properties on the same wafer due to the expectation that some bipolar transistors will be used for different applications, e.g., different types of amplifier circuits. This concern presents a significant technical challenge because multiple fabrication techniques may need to be combined or substituted for simpler fabrication techniques to yield multiple types of transistors on a single wafer. Conventional approaches may require multiple wafers to be used when forming transistors used in different types of amplifier circuits.

SUMMARY

A first aspect of the present disclosure provides a method of forming an integrated circuit (IC) structure, the method including: providing a substrate including: a first semiconductor region, a second semiconductor region, and a trench isolation (TI) laterally between the first and second semiconductor regions; forming a seed layer on the TI and the second semiconductor region of the substrate, leaving the first semiconductor region of the substrate exposed; forming an epitaxial layer on the first semiconductor region of the substrate, and the seed layer, wherein the epitaxial layer includes: a first semiconductor base material positioned above the first semiconductor region of the substrate, and an extrinsic base material positioned above the seed layer; forming an opening within the extrinsic base material and the seed layer to expose an upper surface of the second semiconductor region; and forming a second semiconductor base material in the opening.

A second aspect of the present disclosure provides a method of forming an integrated circuit (IC) structure, the method including: providing a substrate including: a first semiconductor region, a second semiconductor region, and a trench isolation (TI) laterally between the first and second semiconductor regions; forming a seed layer on the TI of the substrate, leaving the first and second semiconductor regions exposed; forming an epitaxial layer on the first semiconductor region of the substrate, and on the seed layer, wherein the epitaxial layer includes: a first semiconductor base material positioned above the first semiconductor region of the substrate, a precursor base positioned above the second semiconductor region of the substrate, and an extrinsic base material positioned above the seed layer; forming an insulator on the first semiconductor base material, the precursor base, and the extrinsic base material; forming an opening within the insulator to expose the precursor base; and growing a semiconductor material on the precursor base to yield a second semiconductor base material, wherein a height of the second semiconductor base material above the substrate is greater than a height of the first semiconductor base material above the substrate.

A third aspect of the present disclosure provides a method of forming an integrated circuit (IC) structure, the method comprising: providing a substrate including: a first semiconductor region, a second semiconductor region, and a trench isolation (TI) laterally between the first and second semiconductor regions; forming a first mask on the TI and the second semiconductor region of the substrate, leaving the first semiconductor region exposed; forming a first semiconductor base material on the first semiconductor region of the substrate; removing a portion of the first mask to expose the second semiconductor region of the substrate; and forming a second semiconductor base material on the second semiconductor region of the substrate, wherein a height of the second semiconductor base material above the substrate is greater than a height of the first semiconductor base material above the substrate.

A fourth aspect of the present disclosure provides an integrated circuit (IC) structure, including: a substrate including: a first semiconductor region, a second semiconductor region, and a trench isolation (TI) laterally between the first and second semiconductor regions; a first semiconductor base material positioned on the first semiconductor region; a second semiconductor base material positioned on the second semiconductor region, wherein a height of the second semiconductor base material above the substrate is greater than a height of the first semiconductor base material above the substrate; an extrinsic base material positioned above the TI of the substrate; a first emitter positioned on the first semiconductor base material; and a second emitter positioned on the second semiconductor base material.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the present disclosure relate to bipolar transistors, including methods of fabricating embodiments of the structures described herein. Methods according to the present disclosure can include forming two or more differently shaped and/or designed semiconductor base materials for bipolar transistors in an integrated group of processes, such that each semiconductor base material has different electrical and physical properties. Methods according to the present disclosure may yield a bipolar transistor structure tailored for use in a "low noise amplifier" (LNA) circuit, in addition to a different bipolar transistor structure suitable for a "power amplifier" (PA) circuit, with both transistors being formed using a single substrate. The differences in capacitance, resistance, and/or current gain between each transistor in the IC structure can stem from one base being sized and/or designed differently from another base. In addition, embodiments of the present disclosure can yield two bipolar transistors which are laterally separated by an extrinsic base material, which may or may not be shared between the two bipolar transistors. It is also understood that embodiments of the present disclosure can offer further structural and/or processing distinctions relative to conventional structures and techniques, but not discussed explicitly herein.

Figure 1:
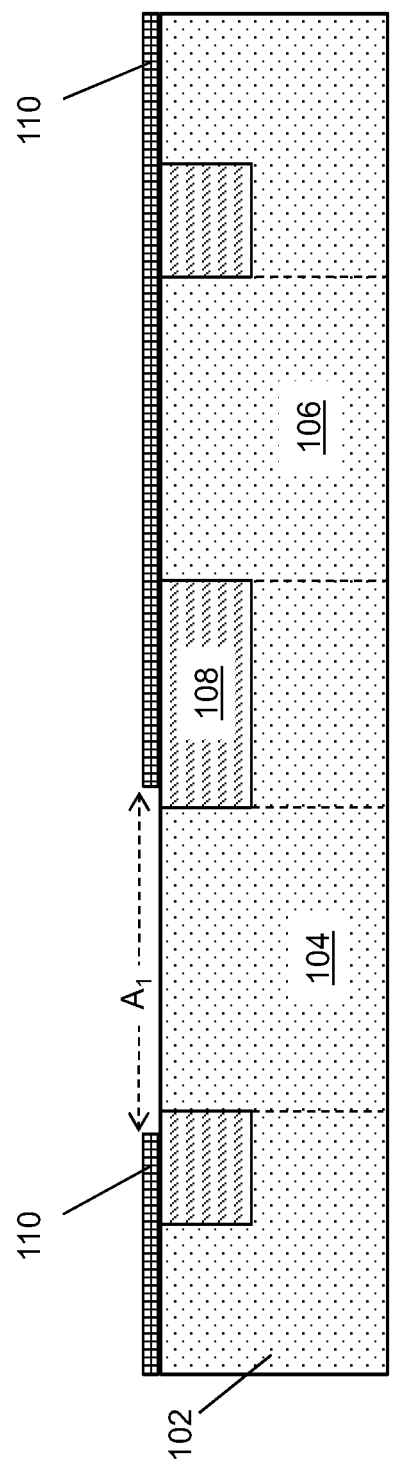
FIG. 1 shows a schematic cross-sectional view of a substrate and seed layer according to various embodiments.

Turning to FIG. 1, a process according to the present disclosure is shown. Methods of the present disclosure can include forming one or more components on a substrate 102. Substrate 102 can be composed of any currently known or later-developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). In an example embodiment, substrate 102 may wholly or partially include silicon germanium (SiGe). Furthermore, the entirety of substrate 102 or a portion thereof may be strained.

Substrate 102 may be subdivided into a group of semiconductor regions, including a first semiconductor region 104 and a second semiconductor region 106. First and second semiconductor regions 104, 106 may be composed of similar or identical materials and/or may include different material compositions, dopants, etc., therein. Regardless of embodiment, each semiconductor region 104, 106 can include different types of dopants and/or doping concentrations for compliance with varying device requirements. First and second semiconductor regions 104, 106 may be doped at any time by any currently-known or later developed technique for doping a material, e.g., directly after first and second semiconductor regions 104, 106 are formed in substrate 102. First and second semiconductor regions 104, 106 can be laterally separated from each other and/or other semiconductor regions of substrate 102 by respective trench isolations (TIs) 108. Each TI 108 can be positioned laterally between, e.g., first and second semiconductor regions 104, 106. TI(s) 108 can be formed by removing portions of first and/or second semiconductor regions 104, 106 to form trenches and then filling with trenches with an electrically insulative material. Each TI can have any desired depth into substrate 102, and in various embodiments may be provided as, e.g., any currently-known or later developed form of shallow trench isolation ("STI") and/or deep trench isolations ("DTI"). TI(s) 108 may be composed of any insulating material such as $SiO_2$ or a "high-k" dielectric having a high dielectric constant, which may be, for example, above 3.9. In some situations, TI(s) 108 may be composed of an oxide substance. Materials appropriate for the composition of TI(s) 108 may include, for example, silicon dioxide ($SiO_2$), silicon nitride (SiN), hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), erbium oxide ($ErO_x$), and other currently known or later-developed materials having similar properties.

Processes of the present disclosure can include forming one or more seed layers 110 on substrate 102, covering second semiconductor region 106 and at least a portion of TI(s) 108. Seed layer(s) 110 can include at least one lateral gap $A_1$ which exposes first semiconductor region 104, while the remaining portions of seed layer(s) 110 cover second semiconductor region 106. Seed layer(s) 110 and/or lateral gap $A_1$ can be formed via any currently known or later-developed process of forming a material, e.g., deposition and etching as defined elsewhere herein. Seed layer 110 can be composed of one or more of the example semiconductor materials described herein with respect to substrate 102, in addition to one or more insulating materials (e.g., oxides) such as those used in the composition of TI(s) 108. Although seed layer(s) 110 are illustrated with a single cross-hatching for clarity of comparison with other elements, it is understood that seed layer(s) 110 may be subdivided into multiple layers. For example, seed layer 110 may include a layer of insulating material positioned directly on an upper surface of substrate 102, and with the remainder of seed layer(s) 110 including semiconductor materials positioned on the layer(s) insulating material. Seed layer(s) 110 may also include, e.g., a mixture of insulator and semiconductor materials. The semiconductor material of seed layer 110 may have a different material composition from that of substrate 102, or may include one or more of the semiconductor materials described elsewhere herein relative to the composition of substrate 102. Seed layer 110 can influence the composition of materials grown epitaxially thereon as discussed elsewhere herein. In an example embodiment, seed layer 110 can be composed of polycrystalline silicon, also known as "polysilicon," to permit epitaxial growth of polycrystalline silicon thereon.

Figure 2:
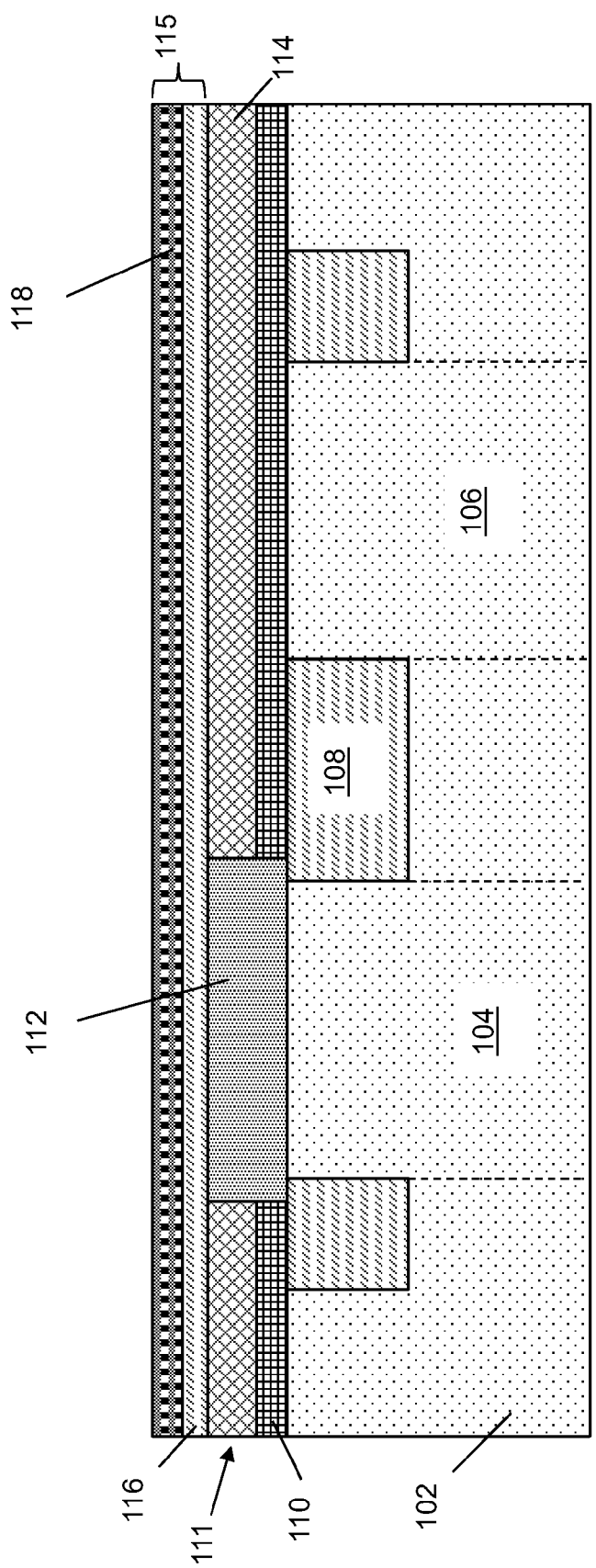
FIG. 2 shows a schematic cross-sectional view of forming an epitaxial layer according to various embodiments.

Turning to FIG. 2, a process of forming a first semiconductor base material is shown according to embodiments of the disclosure. Seed layer 110 can be positioned over second semiconductor region 106 and TI(s) 108 to allow additional materials to be formed exclusively on first semiconductor region 104 and seed layer 110, e.g., by epitaxial growth. Specifically, embodiments of the present disclosure can include forming an epitaxial layer 111 on first semiconductor region 104 and seed layer 110. "Epitaxy" or "epitaxial growth," as used herein, refers to a process by which a thin layer of single-crystal or large-grain polycrystalline material is deposited on an underlying material with similar crystalline properties. One feature of epitaxy is that this process causes the crystallographic structure of an underlying substrate or seed layer (including any defects therein) to be reproduced in the epitaxially grown material. Epitaxial growth can include heteroepitaxy (i.e., growing a material with a different composition from its underlying layer) or homoepitaxy (i.e., growing a material which includes the same composition as its underlying layer).

Epitaxial layer 111 can include a first semiconductor base material 112 formed over first semiconductor region 104, and an extrinsic base region 114 formed over seed layer 110. Epitaxial layer 111 can be formed, e.g., by homoepitaxy, with first semiconductor base material 112 and extrinsic base region 114 having different crystallographic features. Despite these differences between first semiconductor base material 112 and extrinsic base region 114, the totality of epitaxial layer 111 can be formed in a single epitaxy because first semiconductor region 104 can have a different composition based on the presence of seed layer 110. In an example embodiment, first semiconductor base material 112 can include a single crystal film of Si and/or SiGe while extrinsic base region 114 can include polycrystalline Si and/or SiGe. First semiconductor base material 112 can include dopants therein, e.g., a p-type dopant such as Boron (B) which may form the base of the NPN structure in a resulting transistor. First semiconductor base material 112 can additional or alternatively include Carbon (C) therein to reduce diffusion of Boron within first semiconductor base material 112. Portions of epitaxial layer 111 formed over exposed TI(s) 108 can also have a polycrystalline composition, because the insulating materials in TI(s) 108 does not act as a seed layer for materials formed thereon.

To shield epitaxial layer 111 from being modified or processed in subsequent process steps, embodiments of the present disclosure can include forming an insulator cap 115 on an upper surface of epitaxial layer 111. Insulator cap 115 can include one or more insulating materials described elsewhere herein relative to TI(s) 108 of substrate 102. Insulator cap 115 can include several layers of material, each having distinct properties. For example, insulator cap 115 may include an oxide layer 116 formed on epitaxial layer 111, in addition to a nitride layer 118 formed on oxide layer 116. Oxide layer 116 and nitride layer 118 together may provide electrical insulation between layers in IC structures yielded from embodiments of the present disclosure. Insulator cap 115 can be formed, e.g., by one or more techniques for depositing a material on a structure. As used herein, the term "depositing" may include any now known or later-developed technique appropriate for deposition, including but not limited to, for example: chemical vapor deposition (CVD), low-pressure CVD (LPCVD), plasma-enhanced CVD (PECVD), sub-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

Figure 3:
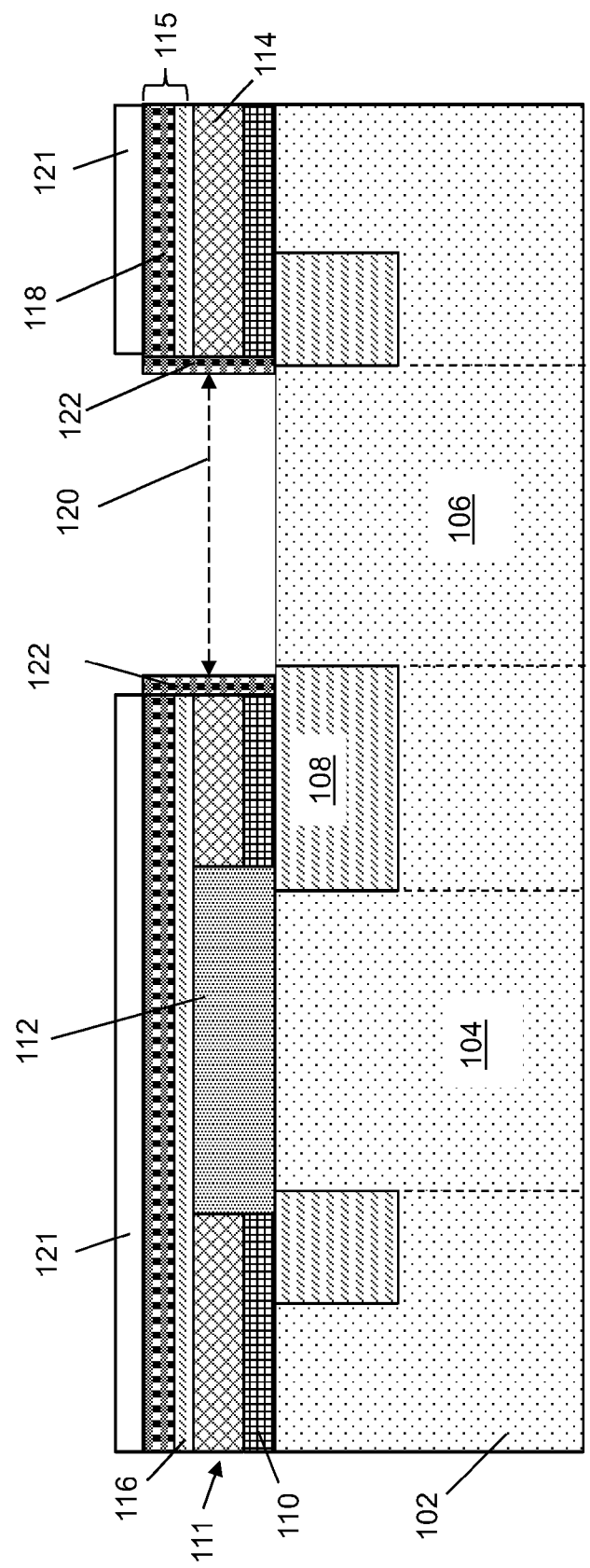
FIG. 3 shows a schematic cross-sectional view of forming an opening to expose a second semiconductor region of the structure according to various embodiments.

Turning to FIG. 3, embodiments of the present disclosure can include forming an opening 120 in the insulator cap layer 115 and epitaxial layer 114 to expose second semiconductor region 106. This can be achieved, e.g., by forming a mask 121 on insulator cap 115 and removing a portion of insulator cap 115 not covered by mask 121. Example compositions of mask 121 can include, e.g., one or more currently known or later-developed photoresist materials. After mask 121 is formed on insulator cap 115, exposed portions of insulator cap 115 can thereafter be removed by any process configured to remove the exposed materials. The term "removing" as used herein can include any one of various material removal or polishing techniques now known or later-developed, e.g., etching, wet etching, a reactive ion etch (RIE), etc. "RIE" or "reactive ion etch" refers to a variation of plasma etching in which, during etching, a semiconductor wafer is placed on an RF powered electrode. Throughout RIE, the wafer may take on an electric potential which accelerates the etching species extracted from plasma toward the etched surface.

Portions of seed layer 110 and extrinsic base layer 114 overlying second semiconductor region 106 can also be removed to expose second semiconductor region 106 and form opening 120. Portions of seed layer 110 and extrinsic base layer 114 can be removed to form opening 120 by the same technique used to remove portions of insulator cap 115 after mask 121 is formed. Alternatively, portions of seed layer 110 and extrinsic base layer 114 can be removed to form opening 120 in a separate process. After opening 120 is formed, mask 121 is removed. Embodiments of the present disclosure can optionally include forming a pair of spacers 122 on opposing sidewalls of opening 120, such that each spacer 122 is positioned on substrate 102 (e.g., over second semiconductor region 106 and/or TI(s) 108). Spacers 122 can be composed of one or more insulating materials, e.g., silicon nitride (SiN) and/or other nitride compounds. Although spacers 122 are shown in the accompanying FIGS. 4-8 for the purposes of example, it is understood that spacers 122 may be omitted in alternative embodiments of the disclosure.

Figure 4:
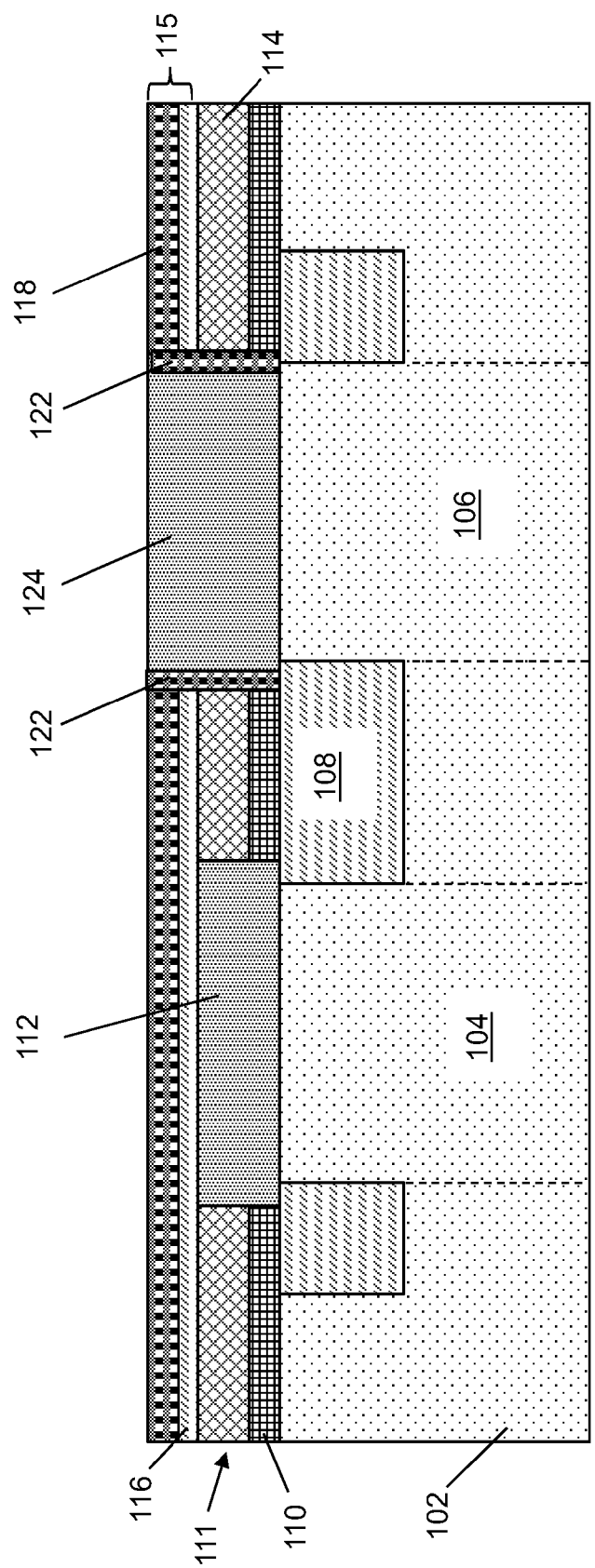
FIG. 4 shows a schematic cross-sectional view of forming a second semiconductor base material according to various embodiments.

Referring to FIG. 4, embodiments of the present disclosure can include forming a second semiconductor base material 124 on second semiconductor region 106. Second semiconductor base material 124 may have the same or similar composition as first semiconductor base material 112, and as an example may include SiGe. However, second semiconductor base material 124 can be formed, shaped, etc., to have different physical properties (e.g., thickness) and electrical properties for a resulting IC structure. For instance, opening 120 (FIG. 3) and second semiconductor material 124 may be formed to have a different (i.e., smaller or larger) cross-sectional area than first semiconductor base material 112. Second semiconductor base material 124 can be formed to have different structural designs and/or types of doping, thickness, material composition, etc., from first semiconductor base material 112. Second semiconductor base material 124 can be formed with a height above substrate 102 greater than that of first semiconductor base material 112 in an example embodiment. Semiconductor material 124 can be grown using selective epitaxy in the cavity 120 such that it only grows in the opening and not on the dielectric stack 115.

Figure 5:
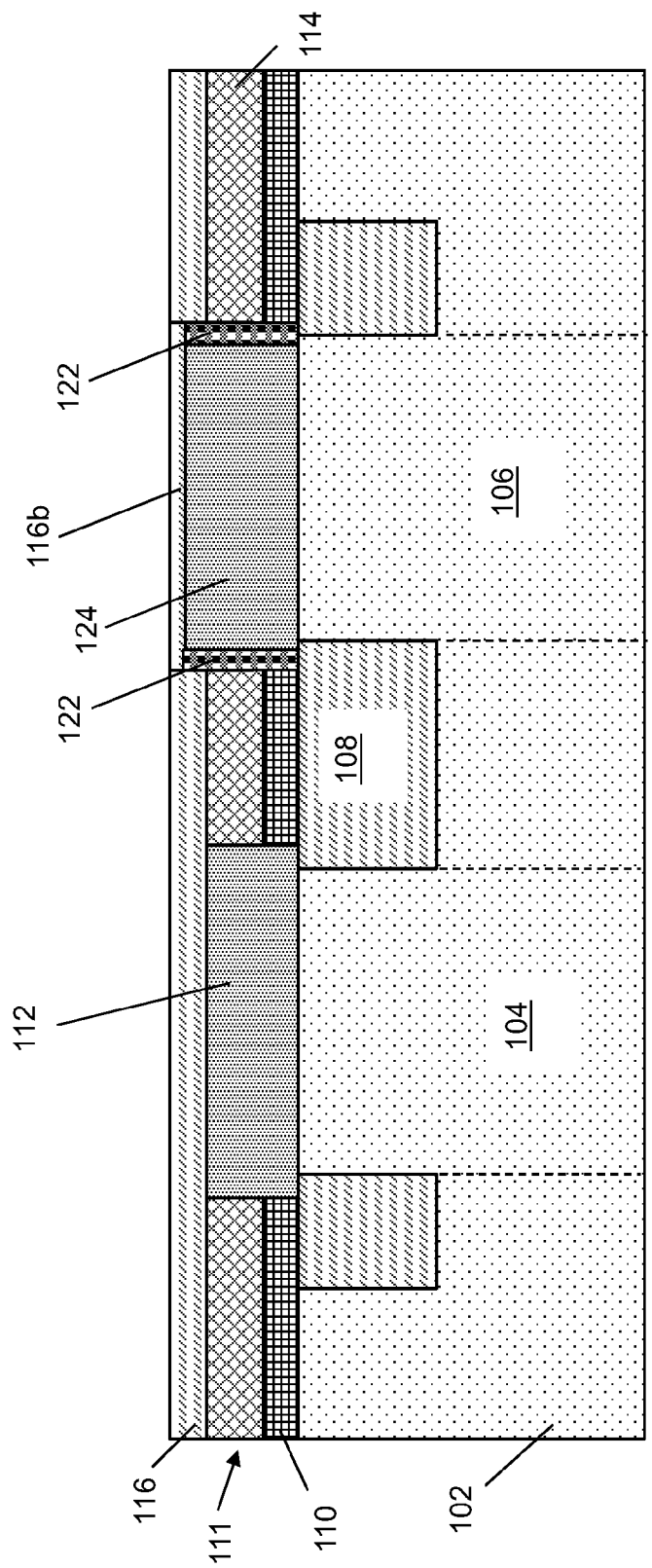
FIG. 5 shows a schematic cross-sectional view of removing a nitride layer according to various embodiments.

Turning to FIG. 5, insulator cap 115 (FIGS. 2-4) can be modified and processed to prepare portions thereof and/or underlying materials for modification in subsequent processes. To protect second semiconductor base material 124 from being modified, removed, etc., an additional oxide layer 116b can be formed thereon to act as a mask for forming or removing of further materials over second semiconductor base material 124. Oxide layer 116b can include the same insulating material(s) and/or different insulating material(s) from those included TI(s) 108 and/or oxide layer 116. In some cases, oxide layer 116b can be grown over second semiconductor base material 124 such that oxide layer 116b only grows over exposed semiconductor regions and not over an exposed dielectric region. Nitride layer 118 and, optionally, portions of spacers 122 can be removed to expose oxide layer(s) 116, 116b. The removing nitride layer 118 can be performed, e.g., by way of a selective etch or a non-selective etch, such that oxide layer 116, 116b and/or remaining portions of spacers 122 and second semiconductor base material 124 remain intact.

Figure 6:
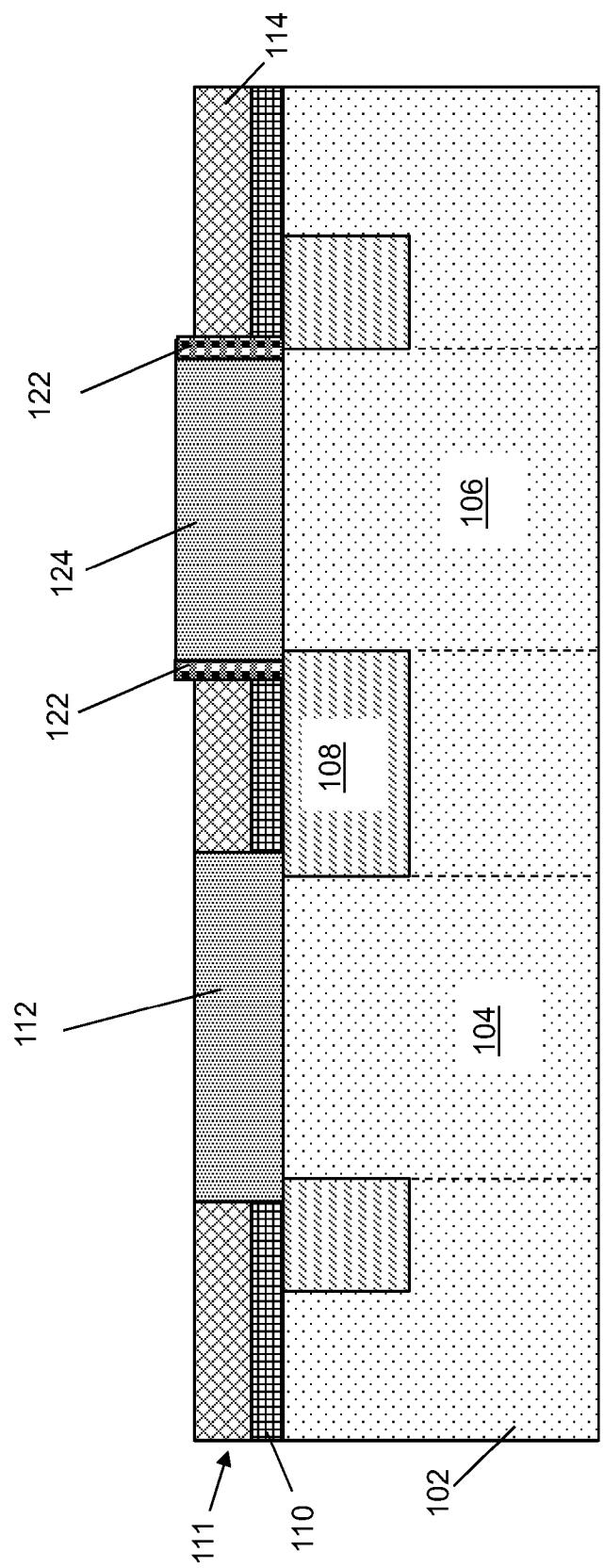
FIG. 6 shows a schematic cross-sectional view of removing insulator layers from the second semiconductor base material according to various embodiments.
Figure 7:
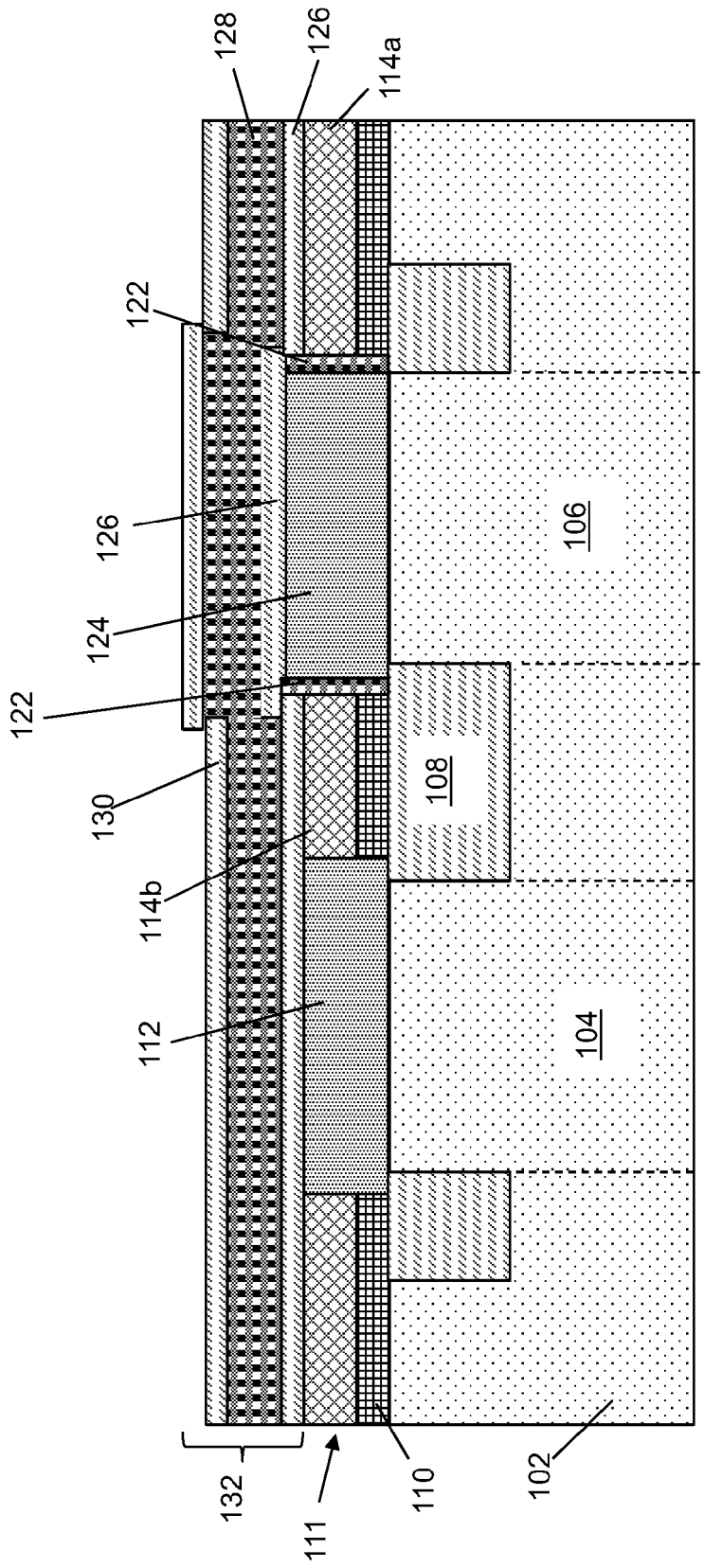
FIG. 7 shows a schematic cross-sectional view of forming an insulator stack on the structure according to various embodiments.

Turning to FIG. 6, oxide layer(s) 116, 116b can be removed to expose first and second semiconductor base materials 112, 124 and extrinsic base material 114. Oxide layer(s) 116, 116b can be removed, e.g., by a non-selective etchant and/or etchant(s) selective to oxide compounds. Removing oxide layer(s) 116, 116b can thereby prepare semiconductor base materials 112, 124 for further processing according to the present disclosure. Turning to FIG. 7, additional materials can be formed on the exposed substances to electrically and physically separate IC structures according to the present disclosure from other structures formed thereon. For example, an insulator layer 126 and a nitride layer 128 can be formed on extrinsic base material 114 and semiconductor base materials 112, 124. Insulator and nitride layers 126, 128 can be formed, e.g., by being deposited on the upper surface of the remaining portions of epitaxial layer 111. A capping oxide layer 130 can then be formed on nitride layer 128, such that oxide layer 116, insulator layer 126, nitride layer 128 and capping oxide layer 130 form respective layers of an insulator stack 132 positioned on first and second semiconductor base materials 112, 124. Insulator stack 132 can be embodied as, e.g., an oxide-nitride-oxide (ONO) stack to separate adjacent layers in an IC structure. Insulator stack 132 can alternatively include other insulating substances arranged in layers, or the same materials arranged differently relative to each other.

Figure 8:
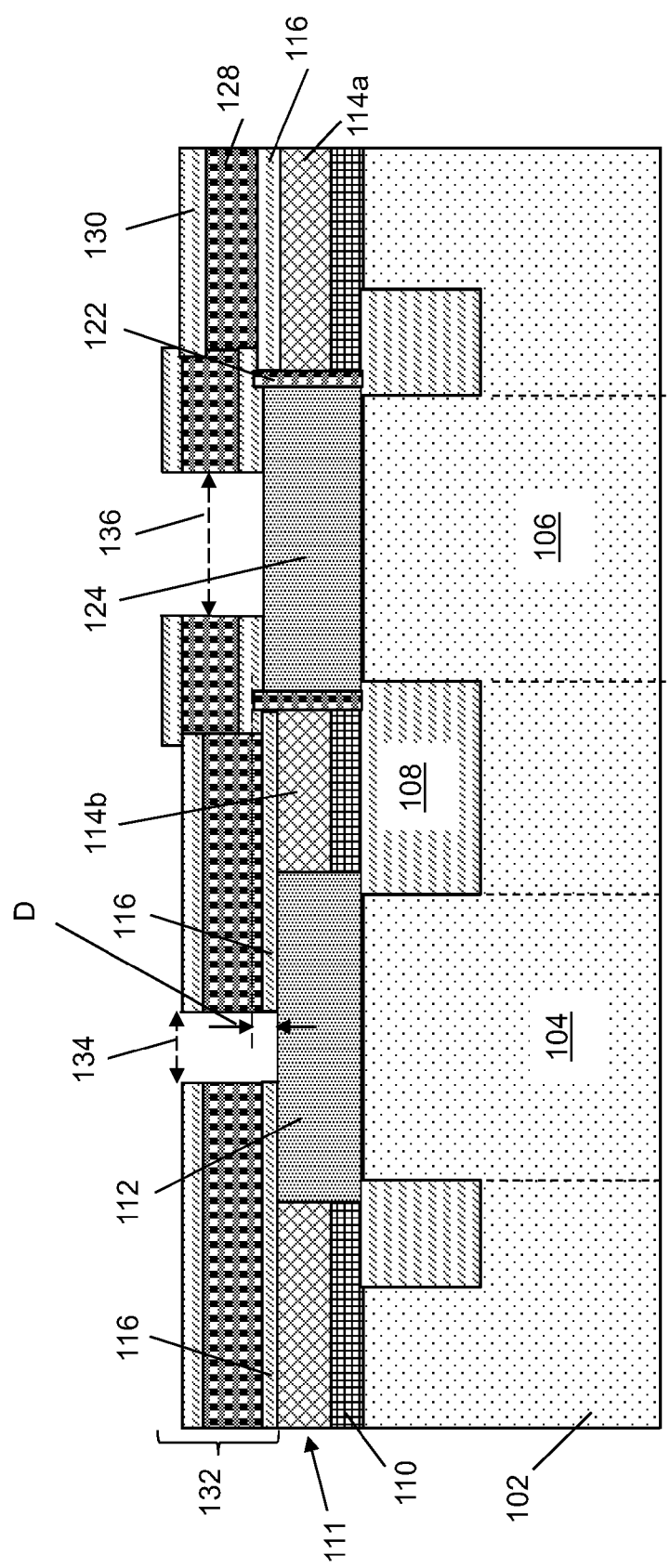
FIG. 8 shows a schematic cross-sectional view of forming emitter openings to expose each base material according to various embodiments.

Turning to FIG. 8, methods according to the present disclosure can include forming a first emitter opening 134 within insulator stack 132 to expose first semiconductor base material 112, and a second emitter opening 136 to expose second semiconductor base material 124. As shown in FIG. 8, second semiconductor base material 124 can extend a height "D" above first semiconductor base material 112 such that second semiconductor base material 124 exhibits a greater height above substrate 102 than first semiconductor base material 112. Although not shown here, alternative embodiments may include second semiconductor base material 124 being shaped to have a height less than or equal to the height of first semiconductor base material 112. The differences in height, material composition, doping profile, etc., between base materials 112, 124 can cause properties such as the electrical resistance, capacitance, etc., across each base material 112, 124 to be distinct. These differences can allow each base material 112, 124 to be used in different types of amplifier circuits despite being formed on the same substrate 102. Portions of insulator stack 132 can be removed to form first and second emitter openings 134, 136, e.g., by forming a mask (not shown) on an upper surface of insulator stack 132 and removing portions therefrom to expose first and second semiconductor base materials 112, 124. Remaining components of a bipolar transistor can be formed in respective emitter openings 134, 136 as discussed elsewhere herein.

Figure 9:
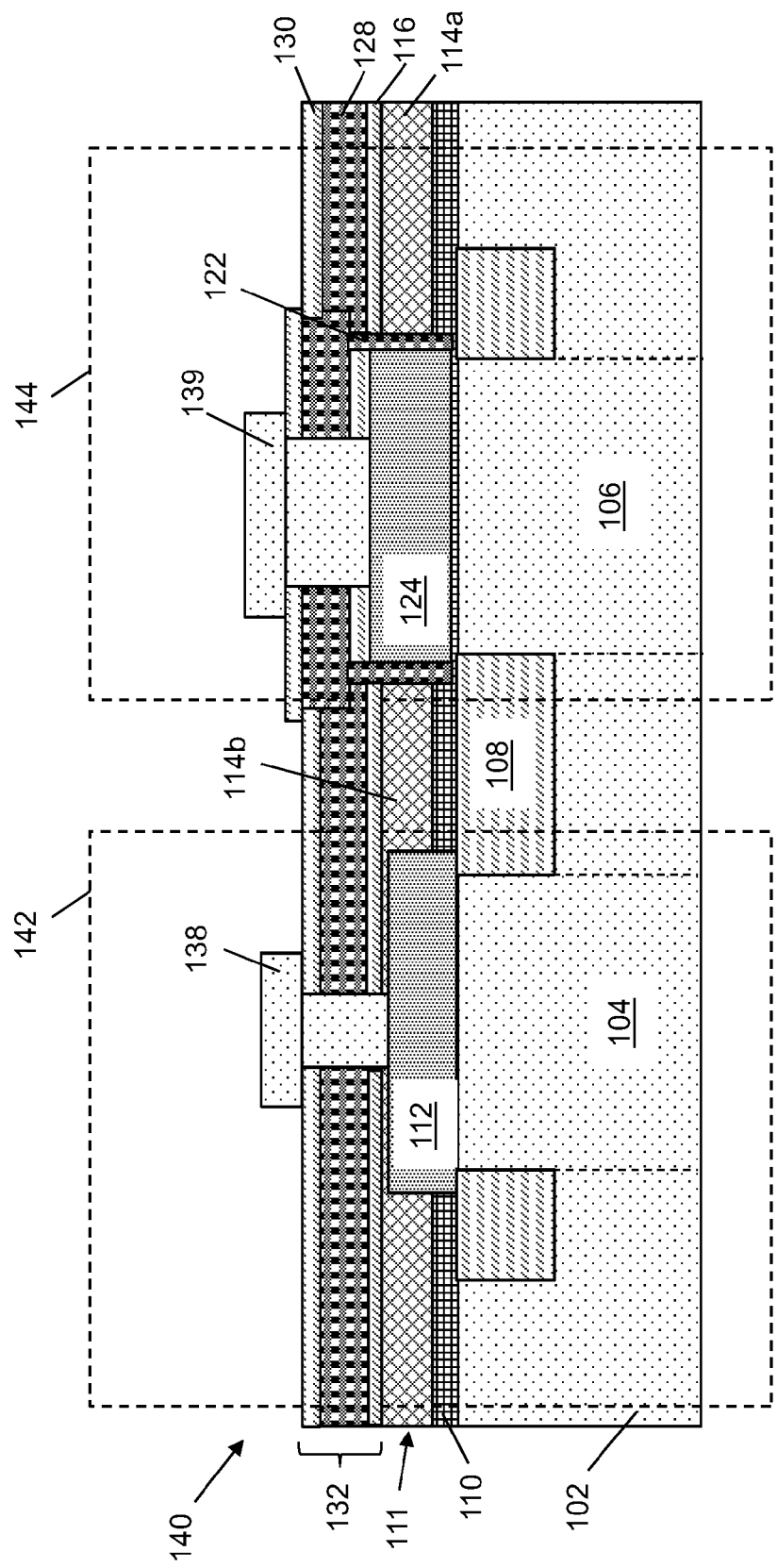
FIG. 9 shows a schematic cross-sectional view of an integrated circuit (IC) structure according to various embodiments.

Referring to FIG. 9, each emitter opening 134, 136 (FIG. 8) can be filled with respective materials to form electrical connections to first and second semiconductor base materials 112, 124. Specifically, a first emitter 138 can be formed in first emitter opening 134, and a second emitter 139 can be formed within second emitter opening 136. Forming emitters 138, 139 can yield an IC structure 140 according to embodiments of the present disclosure, in which first and second semiconductor base materials 112, 124 have different operational characteristics. Emitters 138, 139 may be formed as a layer of heavily-doped semiconductor material that is deposited and then patterned using photolithography and etching processes. For example, emitters 138, 139 may be comprised of a polycrystalline semiconductor material, such as polysilicon deposited by CVD, and may heavily doped with a concentration of a dopant, such as an n-type dopant (e.g. arsenic (As), or phosphorous (P)) for a NPN bipolar transistor.

Differences in size, shape, material composition, doping concentration etc., of each base material 112, 124 can cause differences in capacitance, resistance, current gain, cut-off frequencies etc., in bipolar transistors which include first or second semiconductor base material 112, 124 therein. Specifically, a first bipolar transistor 142 can be implemented as part of a low-noise amplifier (LNA) circuit through the distinct design of first semiconductor base material 112 relative to second semiconductor base material 124, which can reduce noise during operation by providing a lower base-emitter capacitance, a lower base resistance, and higher current gain. A second bipolar transistor 144 can exhibit a lower base-collector capacitance and higher breakdown voltage than first bipolar transistor 142. Second bipolar transistor 144 can therefore be used in a power amplifier (PA) circuit in IC structure 140. A portion of extrinsic base material 114b positioned between bipolar transistors 142, 144 can alternatively be used as an extrinsic base region of first bipolar transistor 142 or second bipolar transistor 144.

Figure 10:
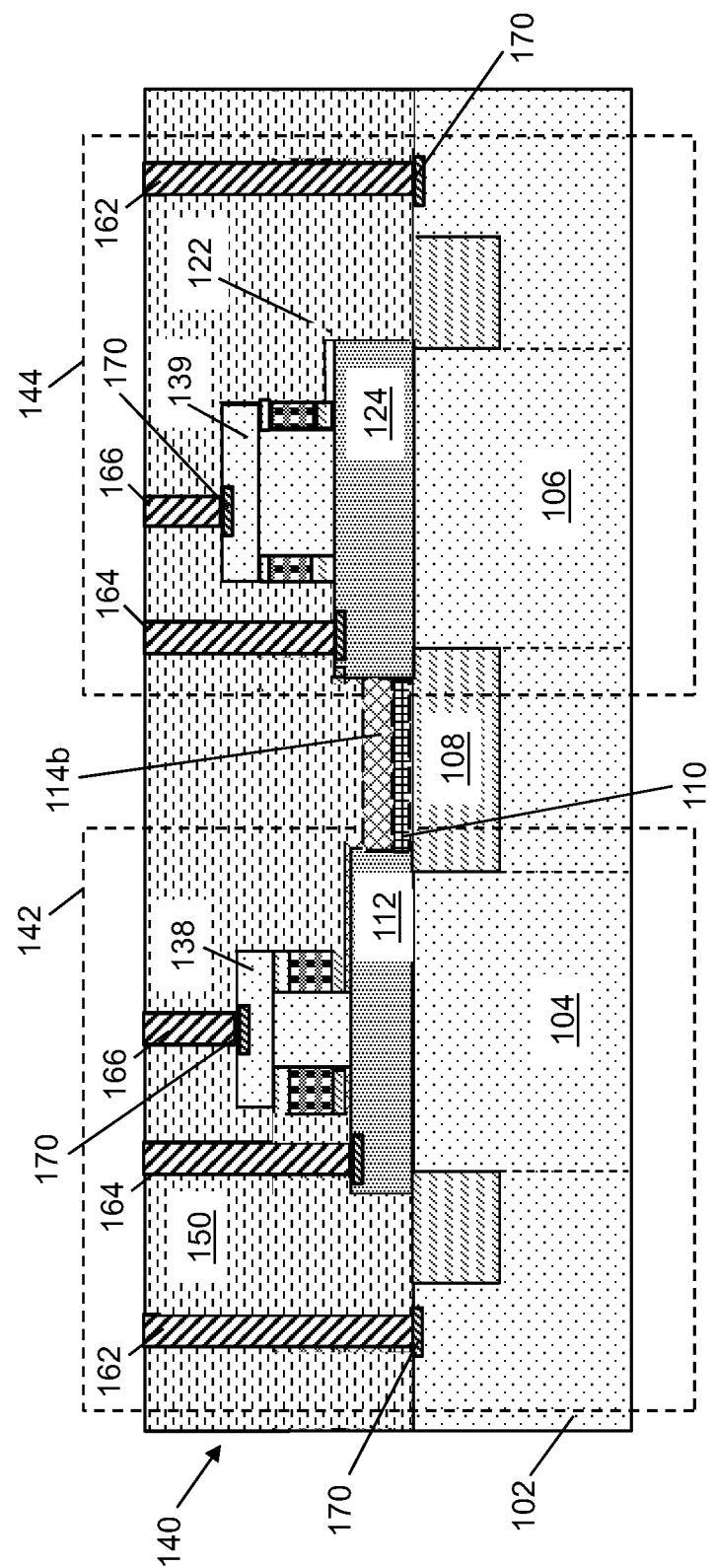
FIG. 10 shows a schematic cross-sectional view of the IC structure with an inter-layer dielectric and contacts according to various embodiments.

Turning to FIG. 10, remaining components of each bipolar transistor 142, 144 can be formed by conventional processing techniques after emitters 138, 139 have been formed. For example, portions of IC structure 140 such as epitaxial layer 111, insulator stack 132, etc., can be targeted for removal to laterally separate bipolar transistors 142, 144 from each other and/or from other structures formed on substrate 142. Portions of material can be targeted for removal, e.g., by forming a mask (not shown) on an upper surface of IC structure 140 and applying a selective and/or non-selective etchant to remove material(s) not covered by masks on IC structure 140. An inter-layer dielectric (ILD) 150 can be formed over the remaining structures. ILD 150 can include any currently-known or later developed material for electrically and physically separating to structures from each other, and may have a different composition from that of TI(s) 108 and/or other insulator materials described herein. In some embodiments, a portion of extrinsic base material 114b (shown in phantom) positioned between bipolar transistors 142, 144 can alternatively be used as an extrinsic base region of first bipolar transistor 142 or second bipolar transistor 144. Any remaining portions of extrinsic base material 114b can also be implanted with dopants (e.g., Boron) to reduce the extrinsic base resistance of each bipolar transistor 142, 144.

Portions of seed layer 110, epitaxial layer 111, insulator stack 132, and ILD 150 can then be removed to form openings (not shown) where contacts to each transistor 142, 144 IC structure 140 may be formed. Collector contact(s) 162 can be formed on substrate 102, base contact(s) 164 can be formed on first and/or second semiconductor base materials 112, 124, and emitter contact(s) 166 can be formed on emitter(s) 138, 139. Before each contact 162, 164, 166 is formed, regions of silicide 170 can be formed on substrate 102, base materials 112, 124, and/or emitter(s) 138, 139 to improve conductivity from each contact 162, 164, 166. "Silicide" generally refers to an alloy of silicon and metals, generally formed by reacting a conductive metal with a semiconductor material to yield a region within a semiconductor material that is more conductive than a remainder of the semiconductor material. IC structure 140 can thereby include bipolar transistors 142, 144 suitable for different types of amplifier circuits, yet formed on the same substrate 102. Other embodiments of the present disclosure can yield various embodiments of IC structure 140 and/or other structures which include bipolar transistors with similar operational differences.

Figure 11:
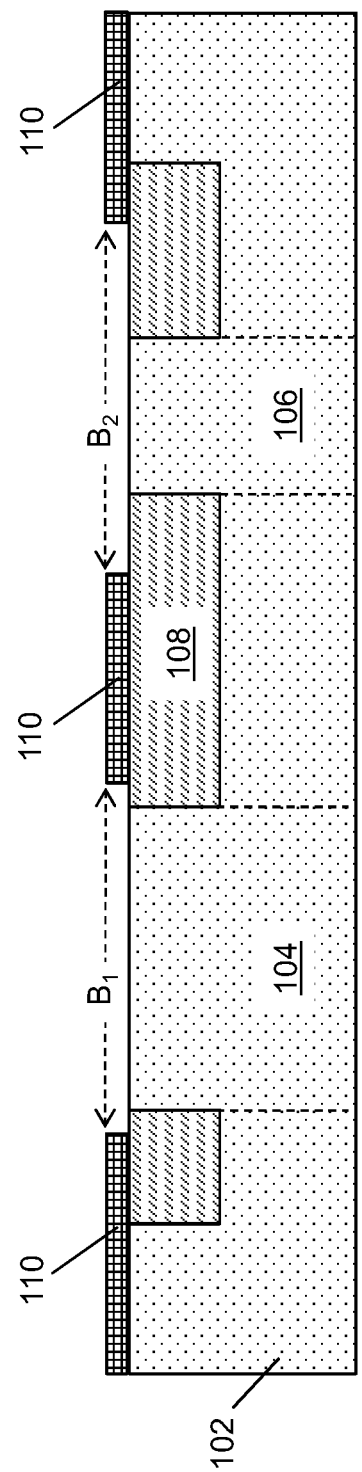
FIG. 11 shows a schematic cross-sectional view of a substrate and seed layer with two openings according to various embodiments.

Turning to FIG. 11, other processes of forming IC structures are shown according to the present disclosure. The various alternative processes described herein can be combined with, or substituted for, other processes described herein. As described elsewhere herein, substrate 102 can include first and second semiconductor regions 104, 106 laterally separated by TI(s) 108. Seed layer 110 can be positioned on substrate 102 to cover TI(s) 108 and some areas of semiconductor materials. As noted above, seed layer(s) 110 may be subdivided into multiple layers and/or may include semiconductive and insulator materials therein, e.g., oxides and/or polysilicon. Openings $B_1$, $B_2$ within seed layer(s) 110 can leave first and second semiconductor regions 104, 106 exposed. Seed layer(s) 110 and openings $B_1$, $B_2$ can be formed, e.g., by deposition and etching as discussed elsewhere herein. First and second semiconductor regions 104, 106 remain exposed to allow additional materials to be formed thereon. As discussed herein, embodiments of the present disclosure can permit additional materials to be formed on first and second semiconductor regions 104, 106 and seed layer 110 simultaneously, e.g., in a single epitaxy process.

Figure 12:
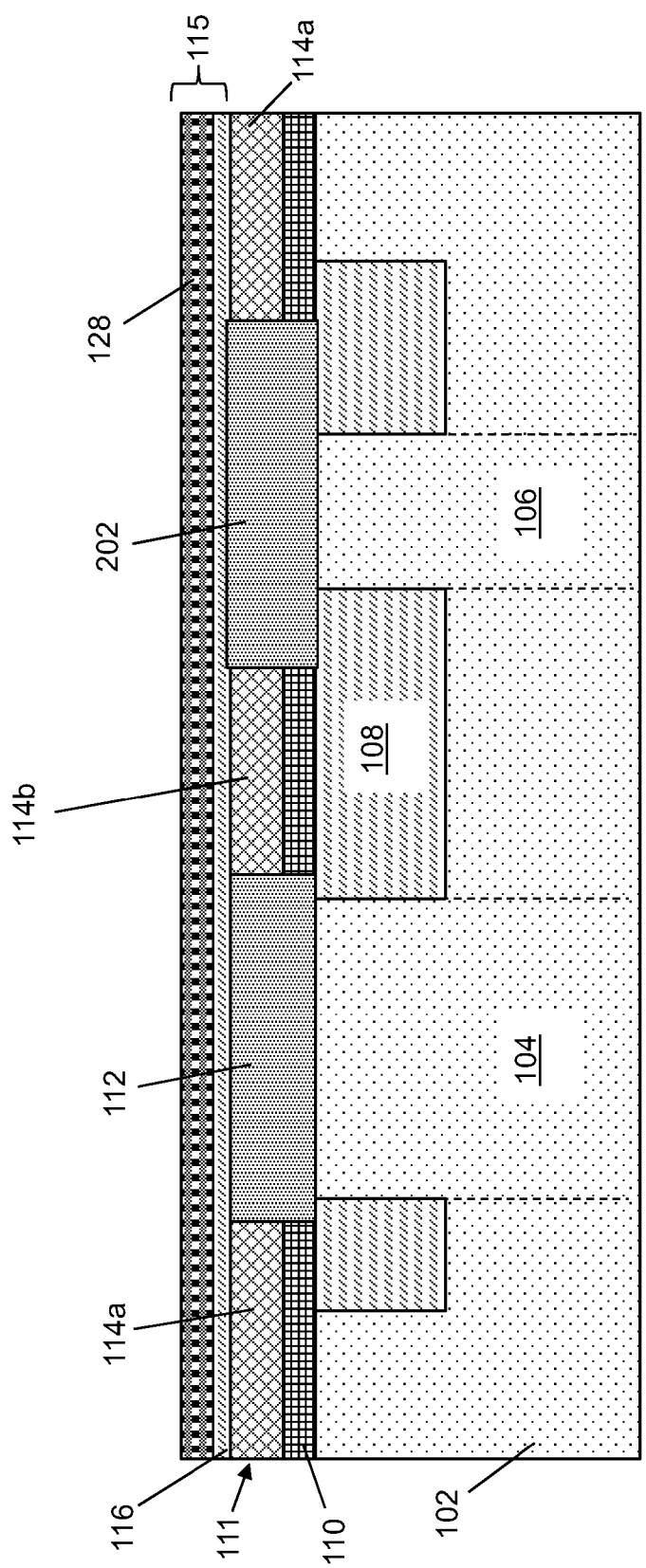
FIG. 12 shows a schematic cross-sectional view of an epitaxial layer being formed according to various embodiments.

Referring to FIG. 12, epitaxial layer 111 can be formed on substrate 102 and seed layer 110. Epitaxial layer 111 can include first semiconductor base material 112 on first semiconductor region 104 and the same semiconductor base material 202 formed on second semiconductor region 106 which can act as a precursor to second semiconductor base material, in addition to extrinsic base material 114 grown on seed layer 110. As discussed elsewhere herein, the crystallographic features of extrinsic base material 114 can be different from first semiconductor base material 112 and precursor base material 202 because each material 112, 114 is grown from a different underlying layer. For instance, base materials 112, 202 can be composed of single crystal silicon, single crystal SiGe, combinations thereof, and/or other materials. Extrinsic base material 114 can be composed of polycrystalline Si, or polycrystalline SiGe, combinations thereof, and/or other materials. A portion of extrinsic base material 114b can be positioned between base materials 112, 202. Other portions of extrinsic base material 114a can be positioned adjacent to first semiconductor base material 112 or precursor base material 202 without being positioned laterally between base materials 112, 202. Although extrinsic base material 114 of epitaxial layer 111 can be formed substantially simultaneously with base materials 112, 202, their material compositions may be different based on material differences between seed layer 110 and first and second semiconductor regions 104, 106. It is understood that base materials 112, 202 and extrinsic base material 114 may be formed by any other currently known or later-developed process of forming a semiconductor material.

After base materials 112, 114, 202 have been formed, insulator cap 115 can be formed thereon and with a plurality of distinct layers as discussed elsewhere herein. Oxide layer 116 of insulator cap 115 can be formed on first semiconductor base material 112, precursor base material 202, and extrinsic base material 114 by deposition or growth and/or any other currently known or later-developed process. In addition, nitride layer 128 of insulator cap 115 can be formed directly on oxide layer 116. Oxide layer 116 and nitride layer 128 of insulator cap 115 can provide electrical insulation between adjacent layers of a resulting IC device, and can also protect underlying structures from being inadvertently removed, modified, etc., in subsequent processes.

Figure 13:
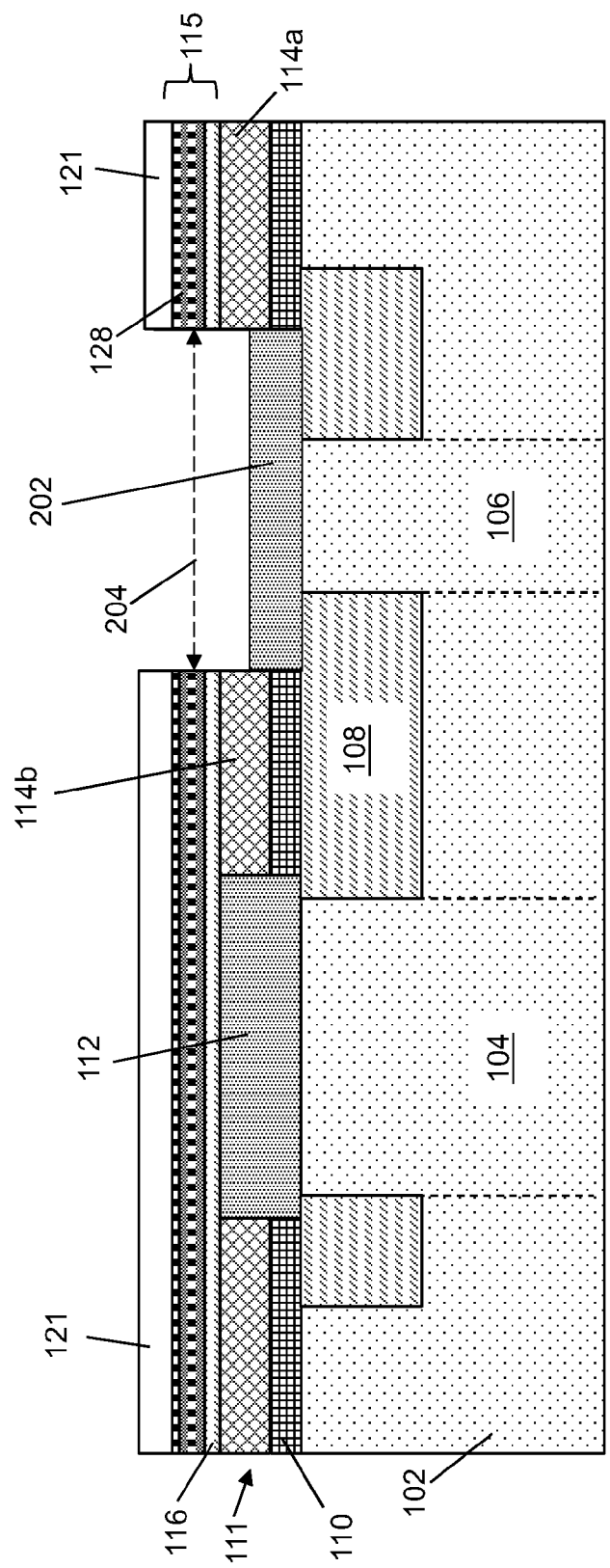
FIG. 13 shows a schematic cross-sectional view of forming an opening to expose a precursor base according to various embodiments.

Referring to FIG. 13, mask(s) 121 can be formed on nitride layer 128 to target underlying materials for removal. For example, mask(s) 121 can be patterned to form an opening 204 positioned over precursor base material 202. After mask(s) 121 are formed, exposed portions of insulator cap 115 (e.g., portions of oxide layer 116 and nitride layer 128) can be removed by etching and/or any other process for removing targeted materials. As portions of oxide layer 116 and nitride layer 128 are removed from the structure, a portion of precursor base material 202 may also be removed. Precursor base material 202 can be partially etched using a timed RIE or wet etch or by using a selective etch which etches Si but not SiGe (or etches SiGe but not Si) in precursor base material 202. Removed portions of base material 202 can be replaced during subsequent processes, e.g., by epitaxially growing new semiconductive material(s) on the remaining portion of base material 202.

Figure 14:
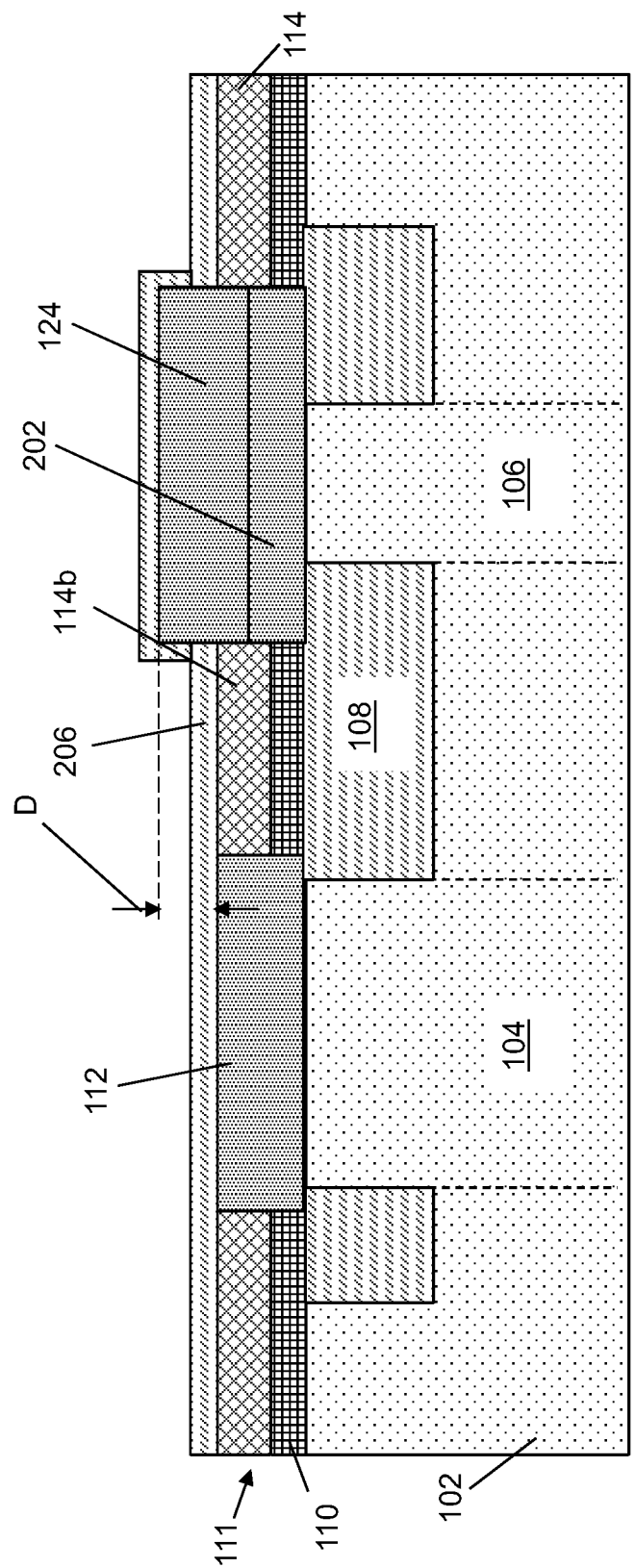
FIG. 14 shows a schematic cross-sectional view of forming a second semiconductor base material and an insulator according to various embodiments.

Turning to FIG. 14, embodiments of the present disclosure can include forming additional semiconductor material on precursor base material 202 to form second semiconductor base material 124 and removing a remainder of insulator cap 115 (FIGS. 12-13). Second semiconductor base material 124 can be formed from precursor base material 202, e.g., by epitaxially growing additional semiconductive material thereon. Second semiconductor base material 124 can be grown using selective epitaxy such that it only grows within opening 204 over semiconductor layer 202, but not on dielectric materials positioned elsewhere. The material composition of second semiconductor base material 124 may be the same or different as that of precursor base material 202, and in some embodiments may include SiGe. Second semiconductor base material 124 can alternatively include other doped or undoped semiconductor materials. For example, second semiconductor base material 124 may be doped with p-type dopants, e.g., boron to form an NPN bipolar transistor, and can have carbon therein to reduce diffusion. Second semiconductor base material 124 may be formed to yield a height differential D between first and second semiconductor base materials 112, 124, e.g., such that second semiconductor base material 124 extends to a greater height above substrate 102 than first semiconductor base material 112. The differences in thickness, material composition and doping profiles between first and second semiconductor base materials 112, 124 can cause these structures to exhibit different electrical properties in a resulting IC structure as discussed elsewhere herein. For example, second semiconductor base material 124 can have a thicker collector region than first semiconductor base material 112, resulting in lower collector-base capacitance and higher breakdown voltage. After second semiconductor base material 124 is formed, insulator cap 115 and/or other insulating materials can be removed from the structure, as described herein. An insulator 206 can then be formed on base materials 112, 124 and extrinsic base material 114 after second semiconductor base material 124 is formed, e.g., to provide physical separation and electrical insulation as described elsewhere herein. Insulator 206 can be embodied, e.g., as an oxide layer which may be grown or deposited on epitaxial layer 111 and semiconductor base materials 112, 124.

Figure 15:
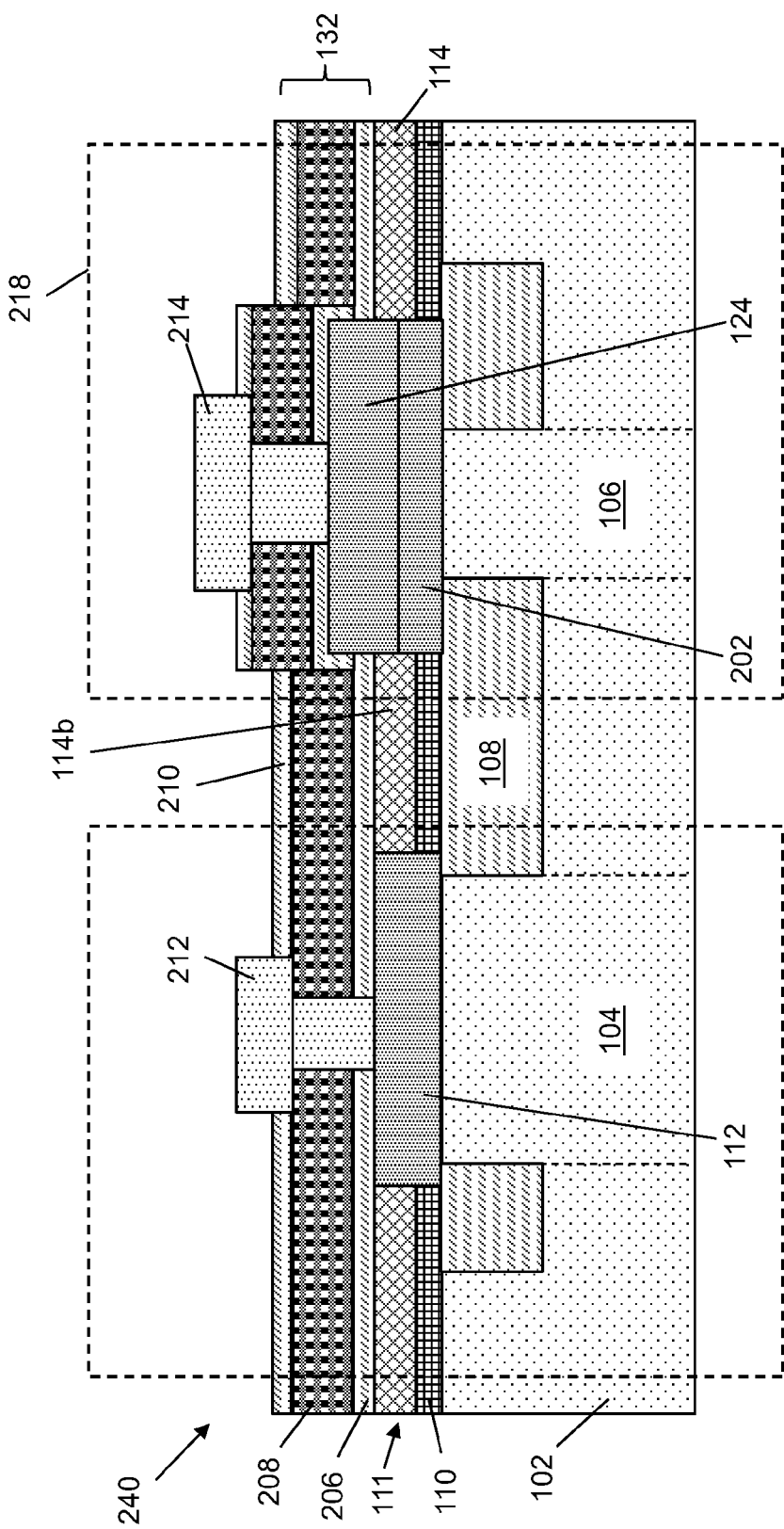
FIG. 15 shows a schematic cross-sectional view of an IC structure according to various embodiments.

Turning to FIG. 15, processes according to the present disclosure can include forming insulator stack 132 including, e.g., a nitride layer 208 on insulator 206 and an oxide layer 210 on nitride layer 208, and/or other arrangements of insulating materials. Insulator stack 132 can vertically separate underlying structures (e.g., first and second semiconductor base materials 112, 124) from other structures formed on insulator stack 132. Portions of insulator 206 and/or insulator stack 132 can be removed to expose underlying portions of first and second semiconductor base materials 112, 124. A first emitter 212 can then be formed on first semiconductor base material 112, and a second emitter 214 can be formed on second semiconductor base material 124 to yield bipolar transistors 216, 218. First bipolar transistor 216 can include, e.g., first semiconductor region 104, first semiconductor base material 112 over first semiconductor region 104, extrinsic base material 114 adjacent to first semiconductor base material 112, and first emitter 212 over first semiconductor base material 112. Second bipolar transistor 218 can include, e.g., second semiconductor region 106, second semiconductor base material 124 positioned over second semiconductor region 106 and sized differently from first semiconductor base material 112, extrinsic base material 114 positioned adjacent to second semiconductor base material 124, and second emitter 214 positioned over second semiconductor base material 124. The position of extrinsic base material 114b between first and second bipolar transistors 216, 218 can allow extrinsic base material 114b to form part of an extrinsic base for either bipolar transistor 216, 218.

Figure 16:
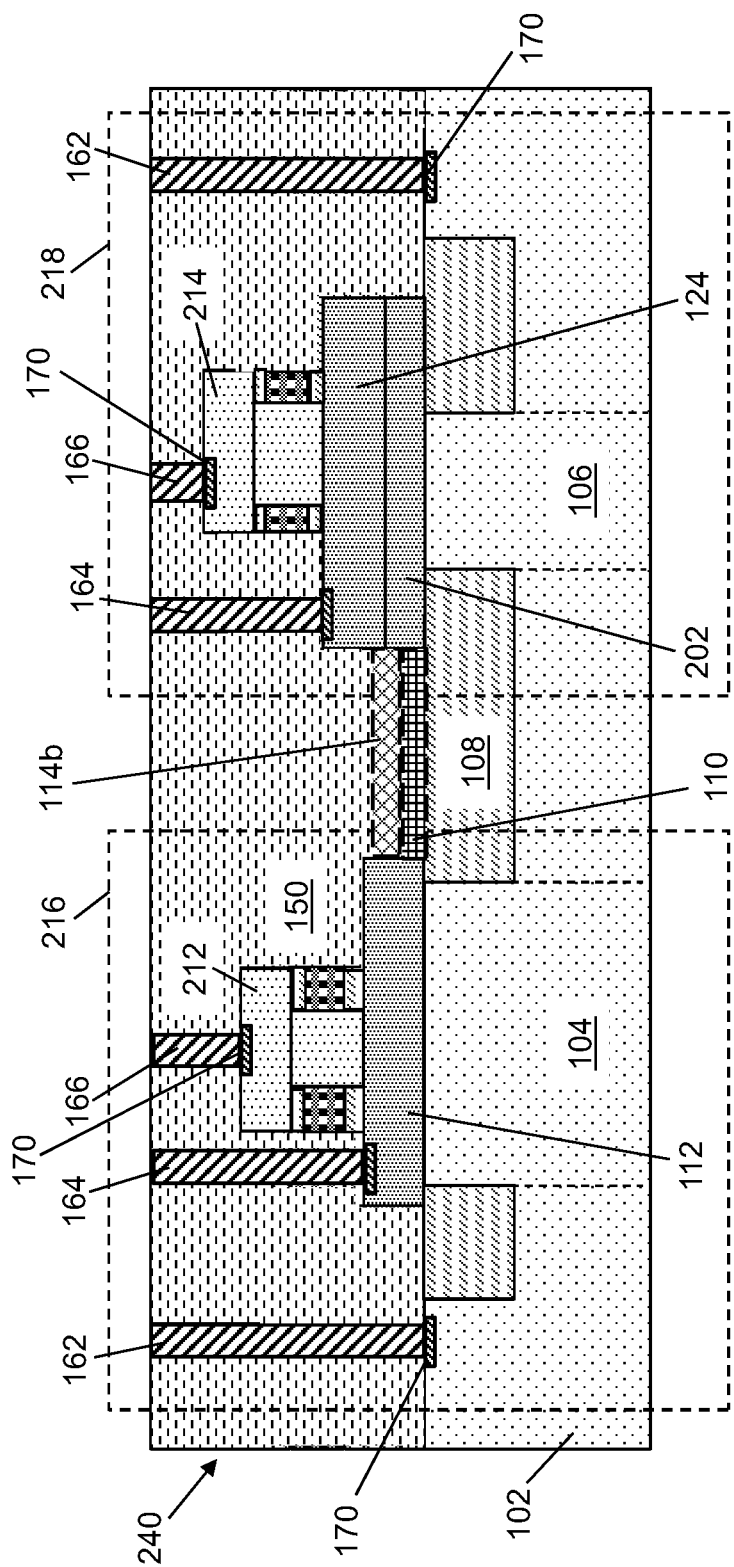
FIG. 16 shows a schematic cross-sectional view of the IC structure with an inter-layer dielectric and contacts according to various embodiments.

Turning to FIG. 16, Remaining components of each bipolar transistor 216, 218 can be formed by conventional processing techniques after emitters 212, 214 have been formed. As noted above, an inter-layer dielectric (ILD) 150 can be formed over substrate 102 by targeting and removing extraneous materials, e.g., remaining portions of epitaxial layer 111 (FIGS. 12-15), insulator stack 132 (FIG. 15), etc., to separate transistors 216, 218 from additional layers formed thereon. Portions ILD 150 can then be removed to form openings where contacts to each transistor 216, 218 may be formed. Collector contact(s) 162 can be formed on substrate 102, base contact(s) 164 can be formed on first and/or second semiconductor base materials 112, 124, and emitter contact(s) 166 can be formed on emitter(s) 212, 214. Silicide regions 170 can be formed on substrate 102, base materials 112, 124, and/or emitter(s) 212, 214 to improve conductivity from each contact 162, 164, 166 as noted elsewhere herein relative to other embodiments. IC structure 240 can thereby include bipolar transistors 216, 218 suitable for different types of amplifier circuits, yet formed on the same substrate 102. Other embodiments of the present disclosure can yield various embodiments of IC structure 140 and/or other structures which include bipolar transistors with similar operational differences.

Base materials 112, 124 having different sizes, shapes, material compositions, doping concentrations, etc., relative to each other can cause each bipolar transistor 216, 218 to have distinct electrical characteristics during operation. For example, each bipolar transistor 216, 218 can have differences in capacitance, resistance, current gain, cut-off frequencies etc. In an example embodiment, first bipolar transistor 216 can have a lower base-emitter capacitance, lower base resistance, and higher current gain than second bipolar transistor 218. Second bipolar transistor 218, by contrast, can exhibit a lower base-collector capacitance and higher breakdown voltage than first bipolar transistor 216. These differences in performance and/or structure can render first bipolar transistor 216 suitable for LNA amplifier circuits during operation. In addition, second bipolar transistor 218 to be a candidate for use in PA amplifier circuits. In alternative embodiments, differences in the size and structure of each base material 112, 124 of bipolar transistors 216, 218 can cause IC structure 240 to include different types of transistors positioned on one substrate 104. As noted elsewhere herein, a portion of extrinsic base material 114$b$ (shown in phantom) positioned between bipolar transistors 216, 218 can alternatively be used as an extrinsic base region of first bipolar transistor 216 or second bipolar transistor 218. Any remaining portions of extrinsic base material 114$b$ can also be implanted with dopants (e.g., Boron) to reduce the extrinsic base resistance of each bipolar transistor 216, 218.

Figure 17:
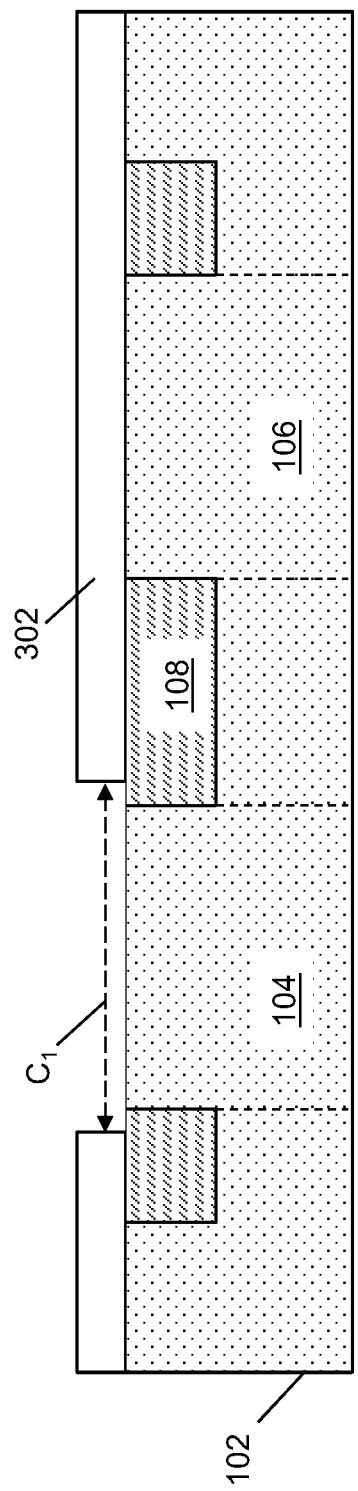
FIG. 17 shows a schematic cross-sectional view of a substrate and first mask according to various embodiments.

Turning to FIG. 17, embodiments of the present disclosure include further processes of forming IC structures with multiple bipolar transistors. For example, a mask 302 can be formed on first and second semiconductor regions 104, 106 and TI(s) 108 of substrate 102. Mask 302 can include, e.g., one or more currently-known or later developed masking materials known in lithography for shielding underlying materials from being affected by processes (e.g., etching) which affect exposed components of a structure. Mask 302 can include, e.g., one or more dielectric materials such as an oxide-nitride stack with nitride materials in mask 302 being positioned over oxide materials of mask 302. An opening $C_1$ within mask 302 can expose first semiconductor region 104, while the remainder of mask 302 can cover second semiconductor region 106 and TI(s) 108. A portion of one or more TI(s) 108 may also be exposed within opening $C_1$ within mask 302.

Figure 18:
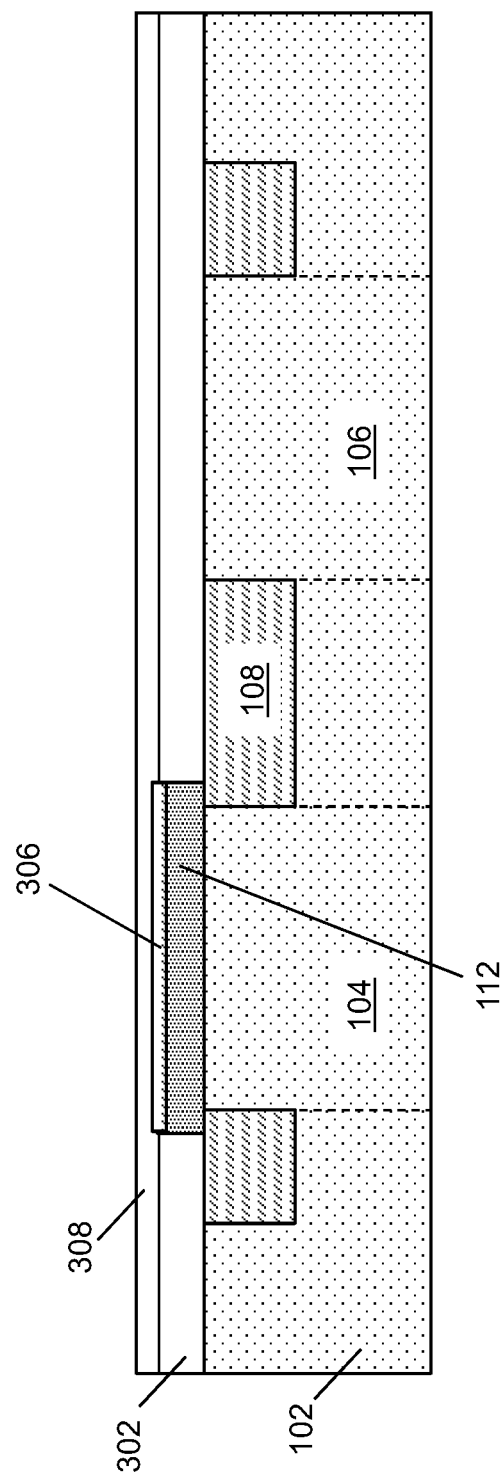
FIG. 18 shows a schematic cross-sectional view of forming a first semiconductor base material and other components according to various embodiments.

Turning to FIG. 18, embodiments of the present disclosure can include forming first semiconductor base material 112 on first semiconductor region 104 within opening C1, e.g., by selective epitaxial growth. The presence of mask 302 on a remainder of substrate 102 can prevent first semiconductor base material 112 from being formed on any other areas on substrate 102. After first semiconductor base material 112 is formed, a fabricator may wish to shield first semiconductor base material 112 from being modified in one or more subsequent processes. Although conventional materials such as masks, insulators, etc., can be formed on first semiconductor base material 112 before additional materials are formed on substrate 102, some embodiments of the present disclosure can include forming a sacrificial insulator 306 on first semiconductor base material 112, e.g., to prevent further epitaxial growth on first semiconductor base material 112. Sacrificial insulator 306 can include one or more insulating materials such as those described by example herein, and in an example embodiment may include an oxide formed, e.g., by growth on substrate 102. A second mask 308 can be formed on first mask 302 and sacrificial insulator 306, such that sacrificial insulator 306 are positioned directly between first semiconductor region 104 and second mask 308. Second mask 308 can include one or more of the same materials used in the composition of first mask 302, and in an example embodiment can be composed of one or more nitride compounds. Second mask 308 can be formed to create a planar upper surface higher above substrate 102 first semiconductor base material 112 and sacrificial insulator 306. In subsequent process steps, the position of second mask 308 can define a height of semiconductor materials formed on second semiconductor region 106 in a subsequent process.

Figure 19:
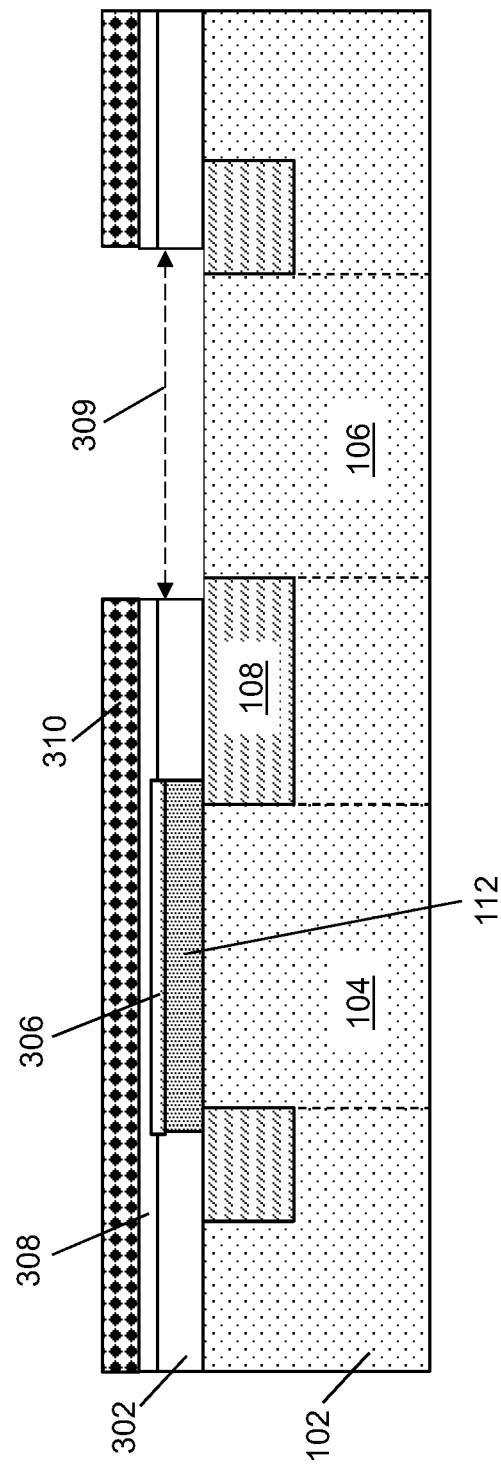
FIG. 19 shows a schematic cross-sectional view of forming an opening to expose the second semiconductor region according to various embodiments.

Referring to FIG. 19, embodiments of the present disclosure can include forming an opening 309 in first and second masks 302, 308 to expose second semiconductor region 106 thereunder. To target portions of first and second masks 302, 308 for removal, a third mask 310 can be formed on an upper surface of second mask 308. Third mask 310 can be composed of, e.g., one or more currently-known or later developed photoresist materials. To provide etch selectivity between first and second masks 302, 308 and third mask 310, third mask 310 can be embodied, e.g., as a hard mask (e.g., titanium (Ti), silicon oxide ($SiO_2$), and/or titanium nitride (TiN)), while first and second masks 302, 308 can include one or more conventional masking and/or insulating materials capable of being selectively etched (e.g., one or more oxides, nitrides, etc.). Opening 309 can alternatively be formed by other processes for targeting and removing specific portions of a material, which may include or omit the use of third mask 310. Third mask 310 can then be removed from the structure, after opening 309 is formed, by any currently known or later-developed process for removing a masking layer.

Figure 20:
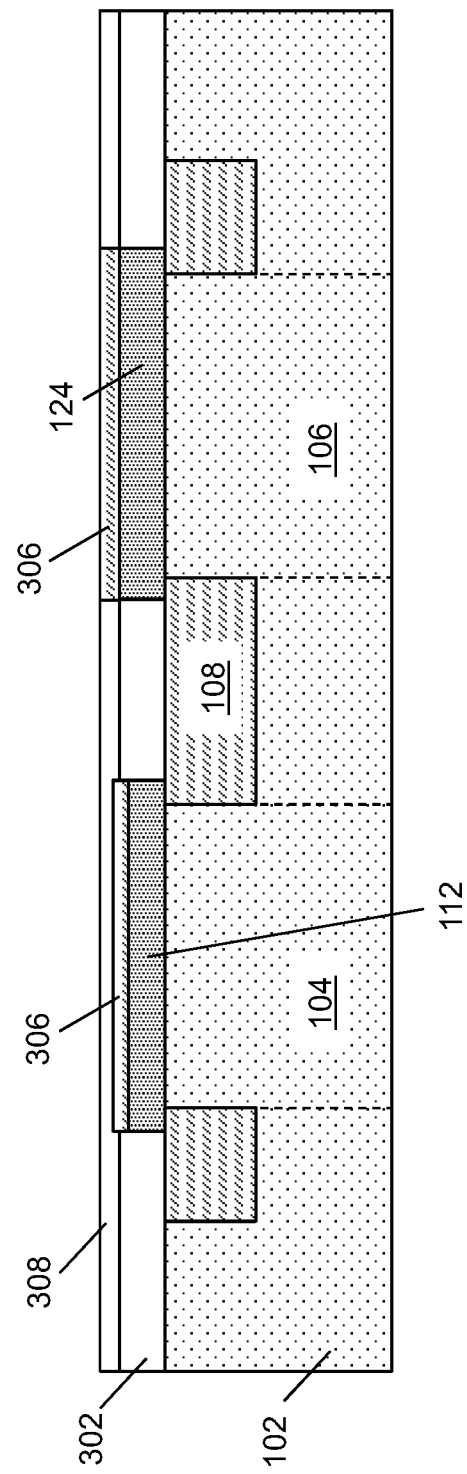
FIG. 20 shows a schematic cross-sectional view of forming a second semiconductor base material according to various embodiments.
Figure 21:
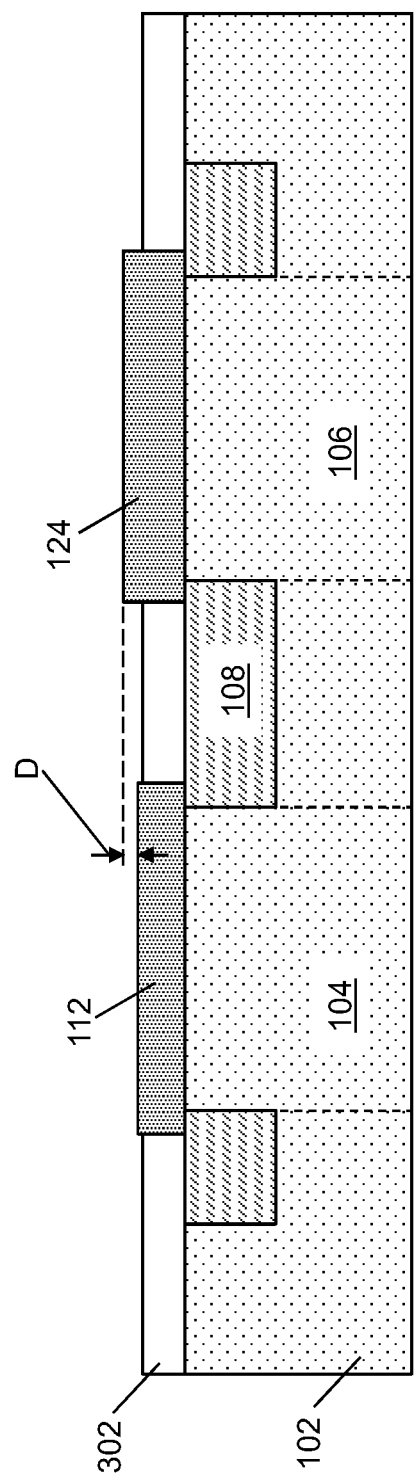
FIG. 21 shows a schematic cross-sectional view of exposing the first and second semiconductor base materials according to various embodiments.

Turning to FIG. 20, second semiconductor base material 124 can be formed on exposed portions of second semiconductor region 106 and within opening 310 (FIG. 19). Second semiconductor base material 124 can be formed by epitaxially growing SiGe and/or other semiconductive materials on second semiconductor region 104. Second semiconductor region 104 can function as a seed layer for epitaxial growth of second semiconductor base material 124 thereon, as discussed in detail elsewhere herein. In an example embodiment, second semiconductor base material 124 can include doped or undoped SiGe. Second semiconductor base material 124 can be formed, e.g., by being grown with selective epitaxy such that second semiconductor base material 124 only grows in the opening 309 and not over dielectric material included in masks 302, 308. An additional sacrificial insulator 306 can be formed on second semiconductor base material 124. Sacrificial insulator 306 may include, e.g., a grown oxide. As shown in FIG. 21 and discussed elsewhere herein, second mask 308 can be removed after sacrificial insulator 306 is formed.

Referring to FIG. 21, first and second semiconductor base materials 112, 124 can be processed to remove one or more materials positioned above first mask 302. For example, sacrificial insulator(s) 306 and/or second mask 308 may be removed by etching the structure with etchant(s) selective to sacrificial insulator(s) 306 and/or second mask 308 without removing or otherwise affecting significant portions of first mask 302 and/or base materials 112, 124. After sacrificial insulator(s) 306 and/or second mask 308 have been removed, base materials 112, 124 can extend to respective heights above substrate 102 and, optionally, above an upper surface of first mask 302. To provide different electrical properties (e.g., resistances, current gains, etc.,) second semiconductor base material 124 can include a height differential D relative to first semiconductor base material 112, such that the upper surface of second semiconductor base material 124 has a greater height above substrate 102 than first semiconductor base material 112. It is understood that the value of height differential D can be varied to provide user-determined differences in performance between two resulting bipolar transistors.

Figure 22:
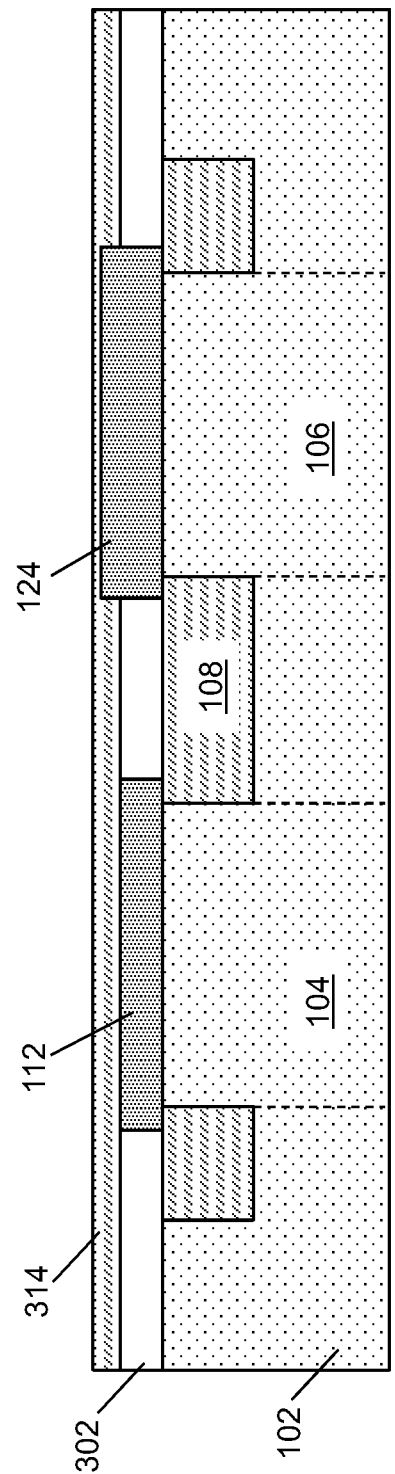
FIG. 22 shows a schematic cross-sectional view of forming an insulator on the first and second semiconductor base materials according to various embodiments.

Turning to FIG. 22, embodiments of the present disclosure can include forming additional materials on first and second semiconductor base materials 112, 124. An insulator 314 can be formed on first and second base structures 112, 124 simultaneously, e.g., by being deposited on first mask 302 and base materials 112, 124 in a single deposition. Insulator 314 can also be planarized such that the height of insulator 314 above substrate 104 is not location-dependent. Insulator 314 can include one or more insulating materials such as those described elsewhere herein, and in an example embodiment can include an oxide compound to serve as a first layer of an insulator stack.

Figure 23:
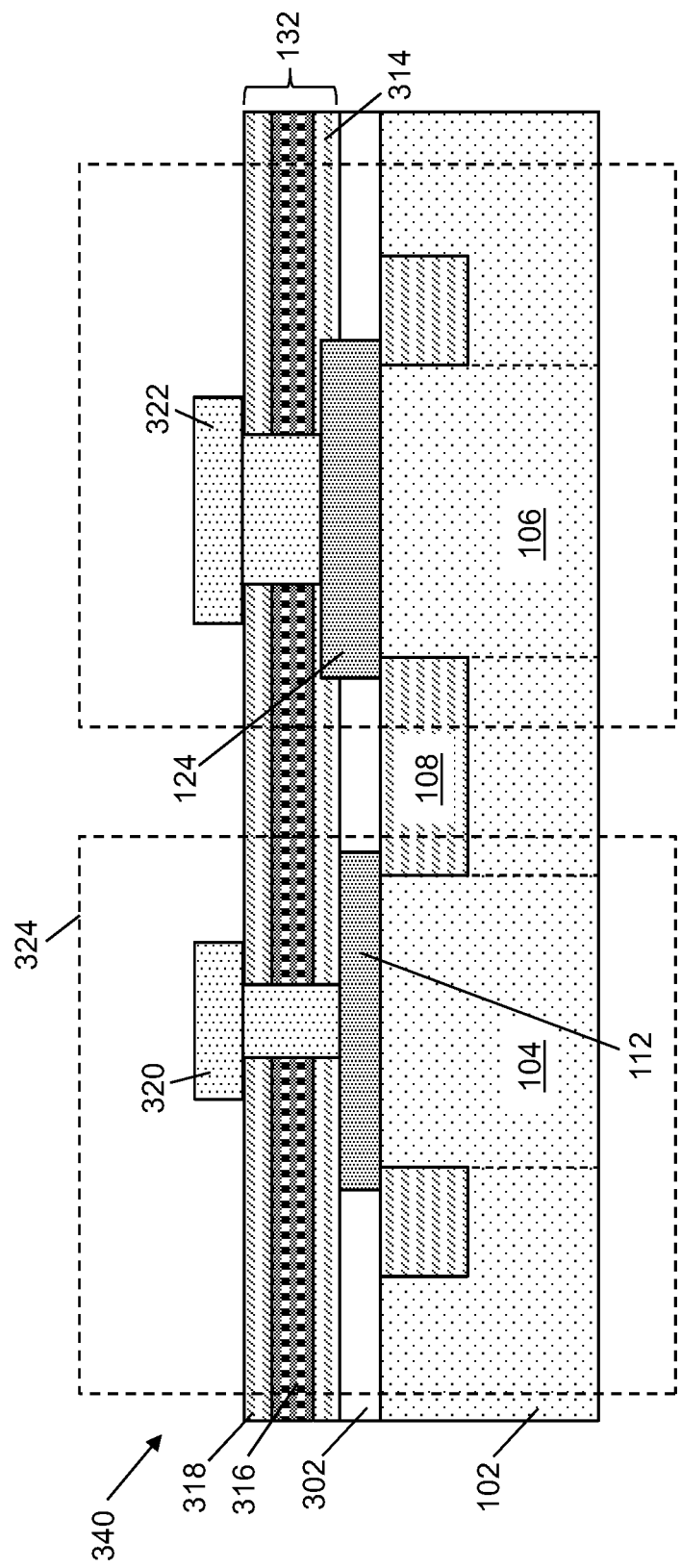
FIG. 23 shows a schematic cross-sectional view of an IC structure according to various embodiments.

Turning to FIG. 23, an insulator stack 132 can be formed to include additional materials formed successively on insulator 314, e.g., a nitride layer 316 and an oxide layer 318. Insulator stack 132 can vertically separate any electrically insulate conductive structures (e.g., first and second semiconductor base materials 112, 124) from other structures formed on insulator stack 132. Portions of first mask 302, insulator 314, and/or insulator stack 132 can be removed to expose underlying portions of first and second semiconductor base materials 112, 124. A first emitter 320 can then be formed on first semiconductor base material 112 and a second emitter 322 can be formed on second semiconductor base material 124 to yield bipolar transistors 324, 326 according to embodiments of the present disclosure. First bipolar transistor 324 can include, e.g., first semiconductor region 104, first semiconductor base material 112, and first emitter 320. Second bipolar transistor 326 can include, e.g., second semiconductor region 106, second semiconductor base material 124, and second emitter 322. Portions of first and second semiconductor base materials 112, 124 can serve as extrinsic base regions in the resulting bipolar transistors 324, 326, or other components can be processed to form separate extrinsic base regions by any currently known or later-developed process of forming extrinsic base regions for first and second semiconductor base materials 112, 124. An IC structure 340 according to embodiments of the present disclosure can therefore include, e.g., first and second bipolar transistors 324, 326 formed with portions of first and second semiconductor regions 104, 106 therein.

Figure 24:
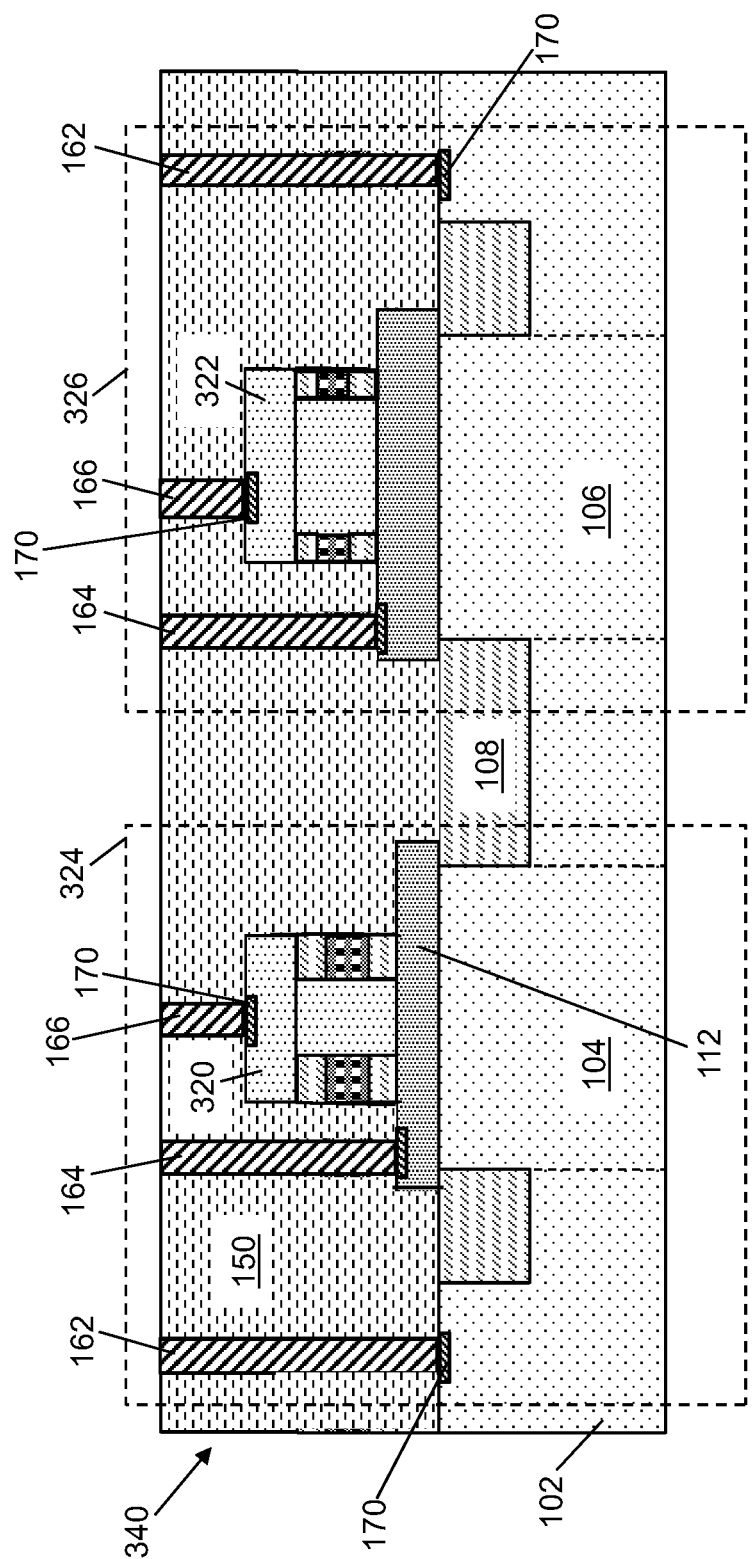
FIG. 24 shows a schematic cross-sectional view of the IC structure with an inter-layer dielectric and contacts according to various embodiments.

Referring to FIG. 24, remaining components of each bipolar transistor 324, 326 can be formed by conventional processing techniques after emitters 320, 322 have been formed. As noted above, portions of insulator stack 132, first mask 302, etc., can be targeted, removed, and then replaced with an inter-layer dielectric (ILD) 150 formed on substrate 102 and/or remaining structures. These processes of removing material and then forming ILD 150 can include any combination of techniques for targeting and removing portions of a structure (e.g., masking and then performing a pattern etch) followed by any currently-known or later developed technique for forming materials, e.g., deposition. ILD 150 can separate transistors 324, 326 from additional layers formed thereon. Portions of first mask 302, insulator stack 132, and ILD 150 can then be removed to form openings where contacts to each transistor 324, 326 may be formed. Collector contact(s) 162 can be formed on substrate 102, base contact(s) 164 can be formed on first and/or second semiconductor base materials 112, 124, and emitter contact(s) 166 can be formed on emitter(s) 320, 322. Silicide regions 170 can be formed on substrate 102, base materials 112, 124, and/or emitter(s) 138, 139 to improve conductivity from each contact 162, 164, 166 as noted relative to other embodiments discussed herein. IC structure 340 can thereby include bipolar transistors 324, 326 suitable for different types of amplifier circuits, yet formed on the same substrate 102. Other embodiments of the present disclosure can yield various embodiments of IC structure 340 and/or other structures which include bipolar transistors with similar operational differences.

Each bipolar transistor 324, 326 can exhibit distinct characteristics (e.g., current gain, resistance, current gain, cut-off frequencies, etc.) as a result of having differently base materials 112, 124 with different sizes, shapes, material compositions, doping concentrations, etc., as described herein. In an example embodiment, first bipolar transistor 324 of IC structure 340 may be a candidate for use in LNA amplifier circuits, as a result of having lower, base-emitter capacitance, lower base resistance, and higher current gain relative to second bipolar transistor 326. Conversely, second bipolar transistor 326 of IC structure 340 can be a candidate for use in PA amplifier circuits by having lower base-collector capacitance and higher breakdown voltage relative to first bipolar transistor 324. These differences can stem from second semiconductor base material 124 having different physical characteristics from first semiconductor base material 112. Each bipolar transistor 324, 326 can be fabricated to yield various types of transistors on one substrate 104, e.g., by varying the size of first and second semiconductor base materials 104, 106 pursuant to the processes described herein.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming an integrated circuit (IC) structure, the method comprising:
providing a substrate including: a first semiconductor region, a second semiconductor region, and a trench isolation (TI) laterally between the first and second semiconductor regions;
forming a seed layer on the TI and the second semiconductor region of the substrate, leaving the first semiconductor region of the substrate exposed;
forming an epitaxial layer on the first semiconductor region of the substrate, and the seed layer, wherein the epitaxial layer includes: a first semiconductor base material epitaxially grown from the first semiconductor region of the substrate, and an extrinsic base material epitaxially grown from the seed layer and formed together with the first semiconductor base material;
forming an opening within the extrinsic base material and the seed layer to expose an upper surface of the second semiconductor region; and
forming a second semiconductor base material in the opening, such that a portion of the extrinsic base material positioned directly between the first semiconductor base material and the second semiconductor base material defines a shared extrinsic base region of the IC structure.

2. The method of claim 1, further comprising:

forming an insulator cap on the epitaxial layer after forming the epitaxial layer; and removing a portion of the insulator cap positioned over the second semiconductor region before forming the opening;

wherein, after filling the opening with the second semiconductor base material, a height of the second semiconductor base material above the substrate is greater than a height of the first semiconductor base material above the substrate.

3. The method of claim 1, wherein the first and second semiconductor base materials include silicon germanium, and wherein the seed layer and the extrinsic base material include polycrystalline silicon.

4. The method of claim 1, further comprising forming a first emitter on the first semiconductor base material and a second emitter on the second semiconductor base material, wherein the first semiconductor region defines a collector of a first bipolar transistor, and wherein the second semiconductor region defines a collector of a second bipolar transistor.

5. The method of claim 4, wherein forming the first and second emitters further includes:

forming an insulator stack on an upper surface of the first semiconductor base material, the second semiconductor base material, and the extrinsic base material;

forming a first emitter opening within the insulator stack above the first semiconductor base material, and a second emitter opening within the insulator stack above the second semiconductor base material; and filling the first and second emitter openings with a semiconductor material.

6. The method of claim 4, wherein the first bipolar transistor comprises a low-noise amplifier (LNA) transistor, and the second bipolar transistor comprises a power amplifier (PA) transistor, the PA amplifier transistor having a lower base-emitter capacitance and higher base resistance than the LNA amplifier transistor.

7. The method of claim 1, wherein forming the epitaxial layer comprises homoepitaxially growing the first semiconductor base material together with the extrinsic base material.

8. The method of claim 1, wherein the first semiconductor base material comprises a single crystal film of silicon (Si) or silicon germanium (SiGe), and wherein the extrinsic base material comprises polycrystalline Si or polycrystalline SiGe.

9. The method of claim 1, wherein the first semiconductor base material includes Boron (B) and Carbon (C).

10. The method of claim 2, wherein the first semiconductor base material and the second semiconductor base material have a same material composition.

11. The method of claim 4, wherein forming the insulator stack includes forming an oxide-nitride-oxide (ONO) stack on the upper surface of the first semiconductor base material, the second semiconductor base material, and the extrinsic base material.

* * * * *